United States Patent
Jin

(10) Patent No.: US 10,388,682 B2
(45) Date of Patent: Aug. 20, 2019

(54) IMAGE SENSOR FOR MEASURING DISTANCE

(71) Applicant: SAMSUNG ELECTRONICS CO., LTD., Suwon-si, Gyeonggi-Do (KR)

(72) Inventor: Young-Gu Jin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/871,407

(22) Filed: Jan. 15, 2018

(65) Prior Publication Data

US 2018/0366504 A1 Dec. 20, 2018

(30) Foreign Application Priority Data

Jun. 15, 2017 (KR) .................. 10-2017-0075815

(51) Int. Cl.
| | |
|---|---|
| *H01L 27/146* | (2006.01) |
| *G01S 17/08* | (2006.01) |
| *G01S 17/36* | (2006.01) |
| *G01S 17/42* | (2006.01) |
| *G01S 17/89* | (2006.01) |

(Continued)

(52) U.S. Cl.
CPC ...... *H01L 27/14614* (2013.01); *G01S 7/4816* (2013.01); *G01S 7/4817* (2013.01); *G01S 7/4914* (2013.01); *G01S 7/4915* (2013.01); *G01S 17/08* (2013.01); *G01S 17/36* (2013.01); *G01S 17/42* (2013.01); *G01S 17/89* (2013.01); *H01L 27/1461* (2013.01);

(Continued)

(58) Field of Classification Search
CPC ............. H01L 27/146–14893; G01S 17/02–36
See application file for complete search history.

(56) References Cited

U.S. PATENT DOCUMENTS 7,626,685 B2 12/2009 Jin et al.
8,519,456 B2 8/2013 Masagaki et al.
(Continued)

FOREIGN PATENT DOCUMENTS

JP 5493669 3/2014
KR 1020160007217 A 1/2016

OTHER PUBLICATIONS

Notice of Allowance from Corresponding Singaporean Application No. SB 10201803204R dated Aug. 15, 2018.

*Primary Examiner* — Bryan R Junge
(74) *Attorney, Agent, or Firm* — Volentine, Whitt & Francos, PLLC

(57) ABSTRACT

The image sensor includes: a semiconductor substrate having a first conductivity type and including a first surface, a second surface opposite to the first surface, and a well region adjacent to the first surface. A first vertical transfer gate and a second vertical transfer gate are spaced apart from each other and extend in a thickness direction of the semiconductor substrate from the first surface to pass through at least a part of the well region. A photoelectric conversion region has a second conductivity type, which is different from the first conductivity type, is located in the semiconductor substrate between the well region and the second surface, and overlaps the first vertical transfer gate and the second vertical transfer gate in the thickness direction of the semiconductor substrate. A wiring structure is located on the first surface of the semiconductor substrate.

17 Claims, 26 Drawing Sheets

(51) Int. Cl.
*G01S 7/481* (2006.01)
*G01S 7/491* (2006.01)

(52) U.S. Cl.
CPC .... *H01L 27/1464* (2013.01); *H01L 27/14627* (2013.01); *H01L 27/14638* (2013.01)

(56) References Cited

U.S. PATENT DOCUMENTS

| | | | |
|---|---|---|---|
| 8,792,087 | B2 | 7/2014 | Spickerrmann et al. |
| 9,117,712 | B1 | 8/2015 | Oggier et al. |
| 9,240,512 | B2 | 1/2016 | Kim et al. |
| 9,385,157 | B2 | 7/2016 | Jung et al. |
| 9,437,633 | B2 | 9/2016 | Chao et al. |
| 2008/0023738 | A1* | 1/2008 | Lenchenkov ..... H01L 27/14625 257/294 |
| 2009/0303371 | A1* | 12/2009 | Watanabe ......... H01L 27/14603 348/311 |
| 2010/0025790 | A1* | 2/2010 | Jang ................. H01L 27/14603 257/432 |
| 2010/0314667 | A1 | 12/2010 | Nozaki et al. |
| 2011/0175187 | A1* | 7/2011 | Ueno ................. H01L 27/1462 257/437 |
| 2012/0199882 | A1* | 8/2012 | Shin ................. H01L 27/14607 257/222 |
| 2013/0307040 | A1 | 11/2013 | Ahn et al. |
| 2014/0347538 | A1* | 11/2014 | Toda ................. H01L 27/14603 348/308 |
| 2014/0374808 | A1 | 12/2014 | Franke et al. |
| 2015/0228693 | A1 | 8/2015 | Toda |
| 2016/0020236 | A1* | 1/2016 | Tanaka ............. H01L 27/14614 257/233 |
| 2016/0020237 | A1* | 1/2016 | Yamakawa ............ H04N 5/374 257/233 |
| 2016/0056198 | A1* | 2/2016 | Lee ................... H01L 27/14612 257/225 |
| 2016/0056199 | A1 | 2/2016 | Kim et al. |
| 2016/0112614 | A1* | 4/2016 | Masuda ........... H01L 27/14621 348/374 |
| 2016/0343756 | A1 | 11/2016 | Fan et al. |

\* cited by examiner

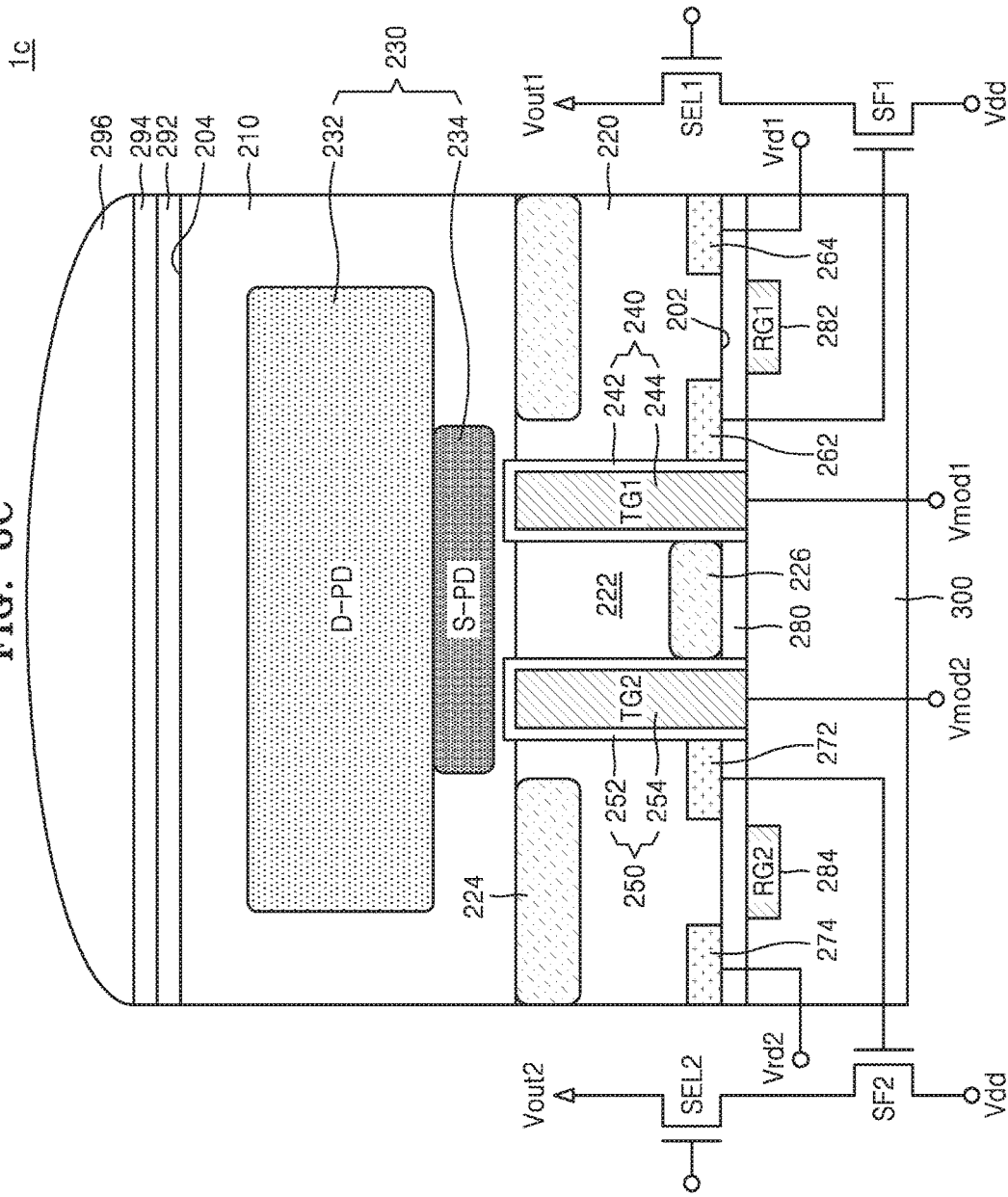

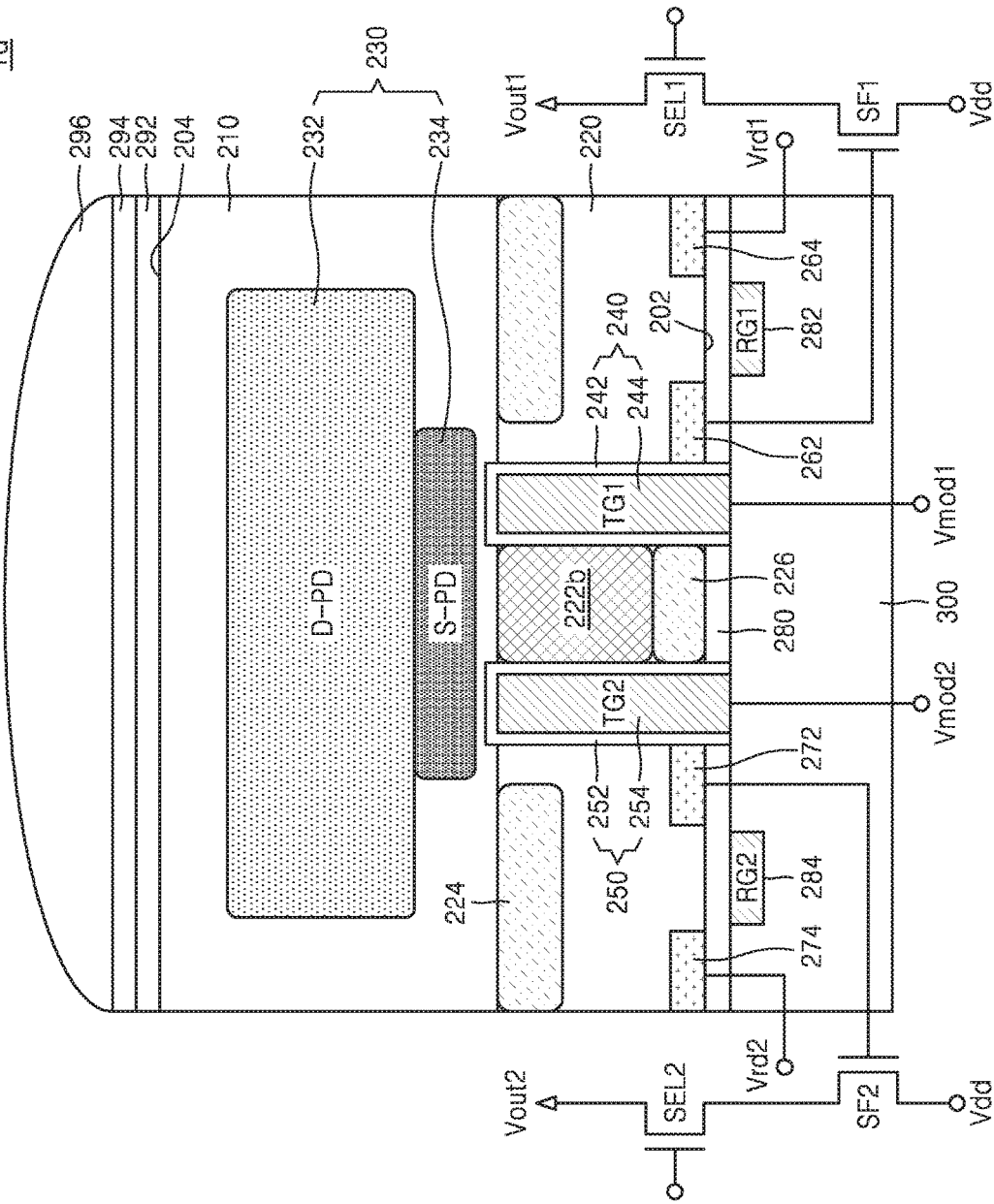

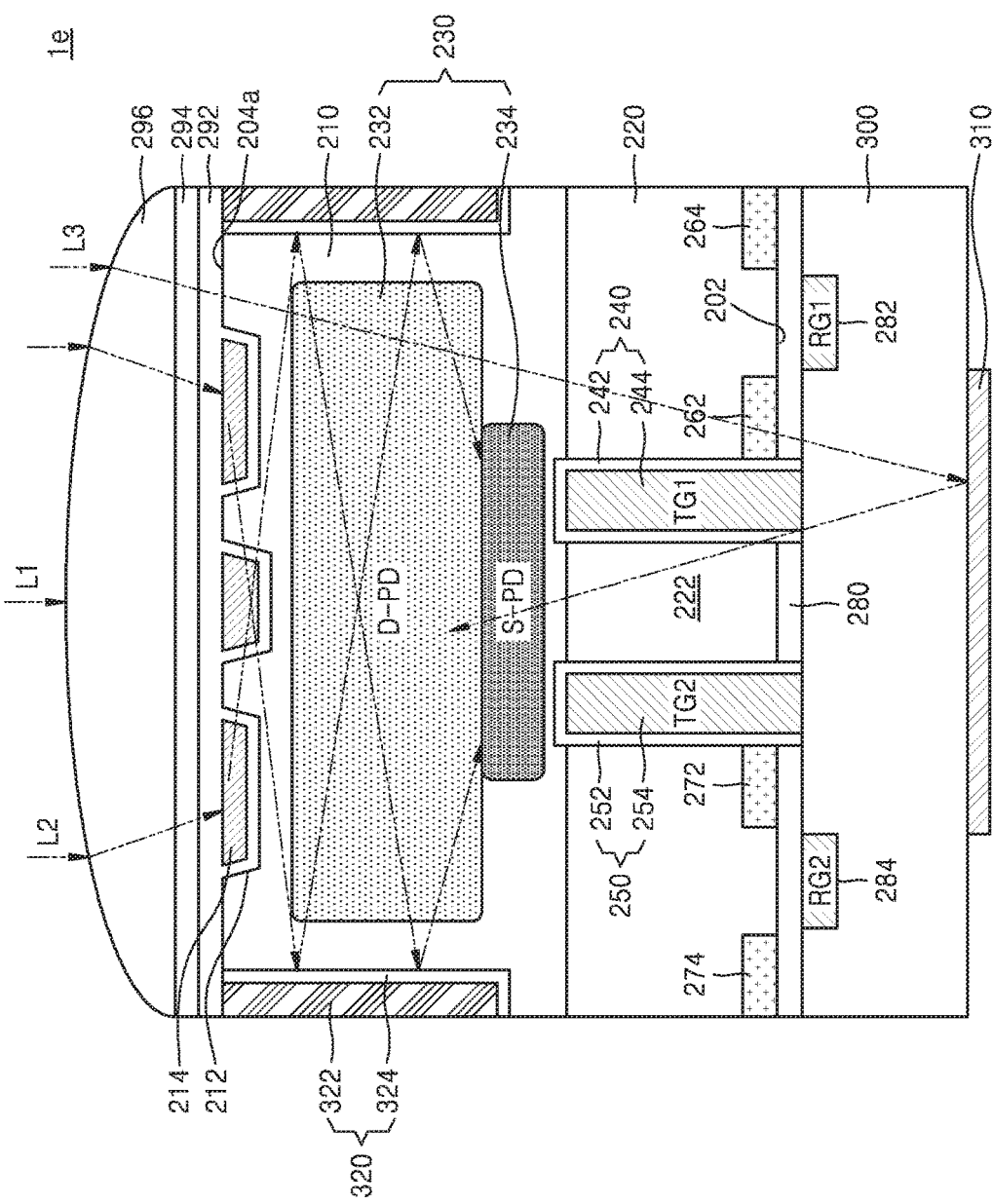

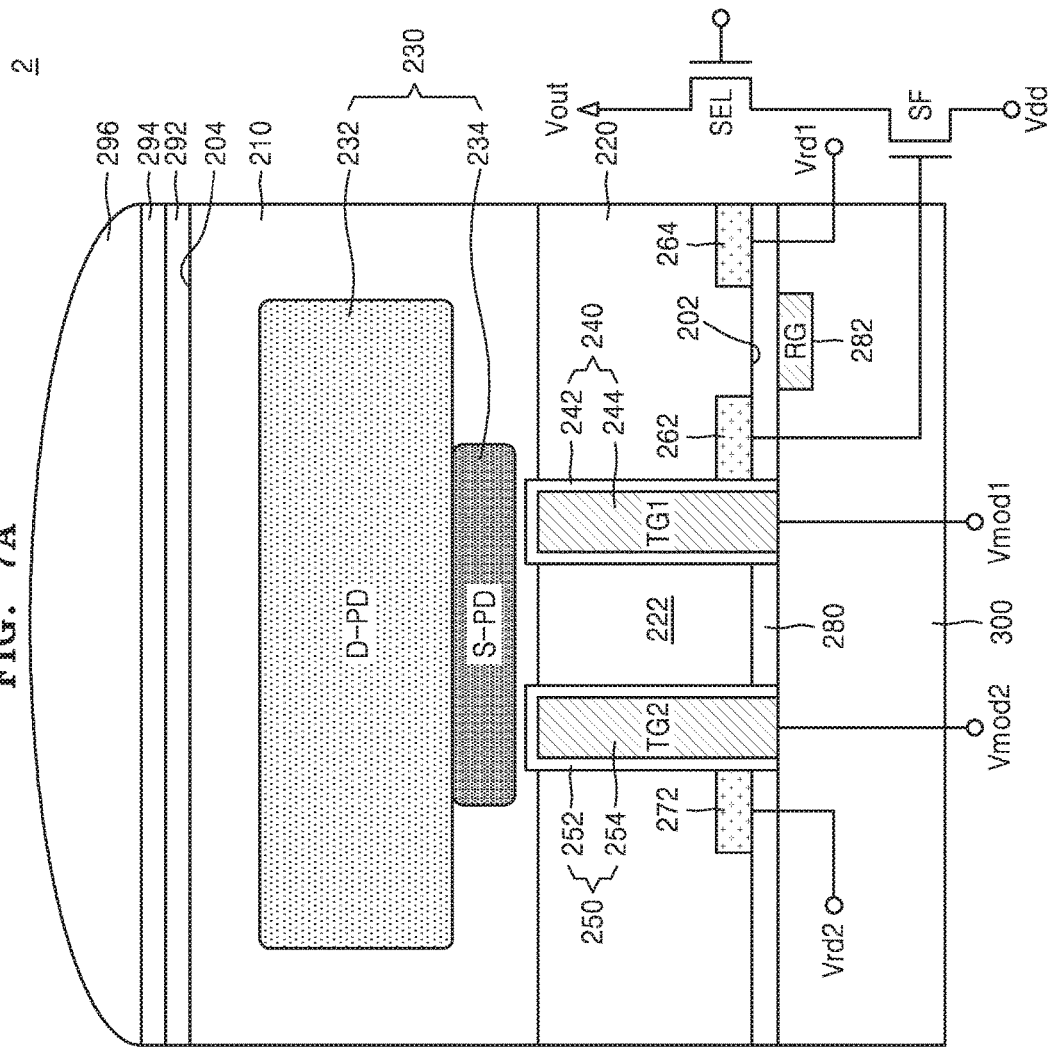

IMAGE SENSOR FOR MEASURING DISTANCE

CROSS-REFERENCE TO RELATED APPLICATION

This U.S. non-provisional patent application claims priority under 35 U.S.C. 119 to Korean Patent Application No. 10-2017-0075815, filed on Jun. 15, 2017 in the Korean Intellectual Property Office, the disclosure of which is incorporated herein in its entirety by reference.

BACKGROUND

1. Field of the Disclosure

The present disclosure relates to an image sensor. More particularly, the present disclosure relates to an image sensor for measuring a distance.

2. Description of the Related Art

A general image sensor does not have information about a distance to a subject. In order to obtain accurate information about a distance to a subject, a time-of-flight (ToF) image sensor has been developed. A time-of-flight image sensor may obtain information about a distance to a subject by measuring a time of flight between a time when light is emitted to the subject and a time when light reflected from the subject is received.

SUMMARY

The present disclosure provides an image sensor for measuring a distance that may miniaturize a pixel and may increase a sensitivity.

According to an aspect of the present disclosure, an image sensor includes: a semiconductor substrate, a first vertical transfer gate and a second vertical transfer gate, a photoelectric conversion region, and a wiring structure. The semiconductor substrate has a first conductivity type and includes a first surface, a second surface opposite to the first surface, and a well region adjacent to the first surface. The first vertical transfer gate and the second vertical transfer gate are spaced apart from each other and extend in a thickness direction of the semiconductor substrate from the first surface to pass through at least a part of the well region. The photoelectric conversion region has a second conductivity type, which is different from the first conductivity type. The photoelectric region is located in the semiconductor substrate between the well region and the second surface, and overlaps the first vertical transfer gate and the second vertical transfer gate in the thickness direction of the semiconductor substrate. The wiring structure is located on the first surface of the semiconductor substrate.

According to another aspect of the present disclosure, an image sensor includes: a wiring structure; a well region, a photoelectric conversion region, a microlens, and at least two transfer gate structures. The well region includes a demodulation region and is located on the wiring structure. The photoelectric conversion region is located on the well region. The microlens is located on the photoelectric conversion region. The at least two transfer gate structures are spaced apart from each other with the demodulation region therebetween and each include a vertical transfer gate extending in a thickness direction of the well region to pass through at least a part of the well region and a transfer gate insulating film surrounding the vertical transfer gate.

According to another aspect of the present disclosure, an image sensor has a backside illumination (BSI) structure and includes: a semiconductor substrate, multiple vertical transfer gates, a first photoelectric conversion region, and a second photoelectric conversion region. The semiconductor substrate has a first conductivity type and includes a first surface, a second surface opposite to the first surface, and a well region adjacent to the first surface. The vertical transfer gates are spaced apart from one another and extend from the first surface to the second surface to pass through at least a part of the well region. The first photoelectric conversion region is located in the semiconductor substrate adjacent to the second surface. The second photoelectric conversion region has a second conductivity type, which is different from the first conductivity type, is located between the first photoelectric conversion region and the well region, and has a width and an impurity concentration respectively less and greater than a width and an impurity concentration of the first photoelectric conversion region.

BRIEF DESCRIPTION OF THE DRAWINGS

Embodiments of the present disclosure will be more clearly understood from the following detailed description taken in conjunction with the accompanying drawings in which:

FIGS. 6A through 6E are cross-sectional views illustrating elements of a unit pixel of an image sensor according to an embodiment;

FIG. 7A is a cross-sectional view illustrating elements of a unit pixel of an image sensor according to an embodiment;

DETAILED DESCRIPTION OF THE EMBODIMENTS

Embodiments will be explained in detail with reference to the accompanying drawings to fully describe elements and effects of the inventive concept(s).

Figure 1:
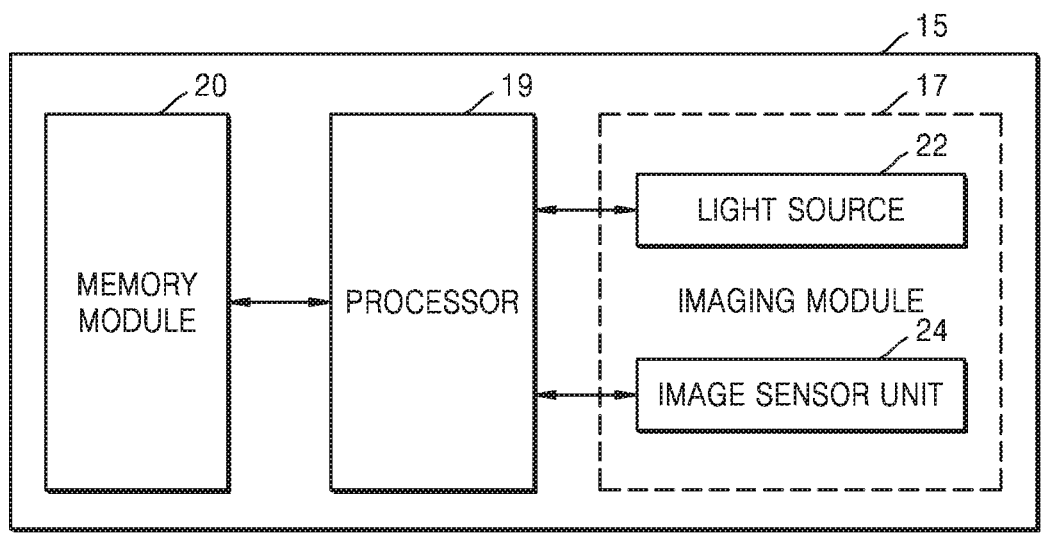
FIG. 1 is a block diagram of a system according to an embodiment.

FIG. 1 is a block diagram of a system 15 according to an embodiment.

Referring to FIG. 1, the system 15 may include an imaging module 17 that communicates with a processor 19 or a host. In some embodiments, the system 15 may further include a memory module 20 that is connected to the processor 19 and stores information such as image data received from the imaging module 17. In some embodiments, the system 15 may be integrated into one semiconductor chip. In other embodiments, each of the imaging module 17, the processor 19, and the memory module 20 may be provided as a separate semiconductor chip. In some embodiments, the memory module 20 may include one or more memory chips. In some embodiments, the processor 19 may include multiple processing chips.

The system 15 may be a low power electronic apparatus for application of an image sensor for measuring a distance according to an embodiment. The system 15 may be portable or stationary. When the system 15 is portable, examples of the system 15 may include a mobile device, a mobile phone, a smartphone, user equipment (UE), a tablet, a digital camera, a laptop, a desktop computer, an electronic smart watch, a machine-to-machine (M2M) communication device, a virtual reality (VR) device, a VR module, and a robot. When the system 15 is stationary, examples of the system 15 may include a game console of a video game room, an interactive video terminal, a vehicle, a machine vision system, an industrial robot, a VR device, and a car interior camera (e.g., a camera for monitoring whether a driver is sleepy).

In some embodiments, the imaging module 17 may include a light source 22 and an image sensor unit 24. The light source 22 may be, for example, a laser diode (LD) or a light-emitting diode (LED) emitting infrared or visible light, a near-infrared (NIR) laser, a point light source, a white lamp, a monochromatic light source combined with a monochromator, or a combination of another laser source. In some embodiments, the light source 22 may emit infrared light having a wavelength ranging from about 800 nm to about 1000 nm. The image sensor unit 24 may include a pixel array and auxiliary processing circuits as shown and described in FIG. 2.

For example, the processor 19 may be a central processing unit (CPU) that is a general-purpose processor. The "processor" and "CPU" may be interchangeably used for convenience of explanation. In some embodiments, the processor 19 may be or further include a microcontroller, a digital signal processor (DSP), a graphics processing unit (GPU), and/or an application-specific integrated circuit (ASIC) processor in addition to the CPU. Also, the processor 19 may include one or more CPUs that operate in a distributed processing environment. The processor 19 may be configured to execute instructions and process data in accordance with an instruction set architecture (ISA) such as x86 ISA (e.g., 32-bit version or 64-bit version), PowerPC® ISA, or microprocessor without interlocked pipeline stages (MIPS) ISA, depending on reduced instruction set computer (RISC) ISA. For example, the processor 19 may be a system on chip (SoC) having functions in addition to a function of the CPU.

The memory module 20 may be, for example, a dynamic random-access memory (DRAM) such as a synchronous DRAM (SDRAM), a high bandwidth memory (HBM) module, or a DRAM-based three-dimensional stacked (3DS) memory module such as a hybrid memory cube (HMC) memory module. The memory module 20 may be, for example, a solid-state drive (SSD), a DRAM module, or a semiconductor-based storage such as a static random-access memory (SRAM), a phase-change random-access memory (PRAM), a resistive random-access memory (RRAM), a conductive-bridging RAM (CBRAM), a magnetic RAM (MRAM), or a spin-transfer torque MRAM (STT-MRAM).

Figure 2:
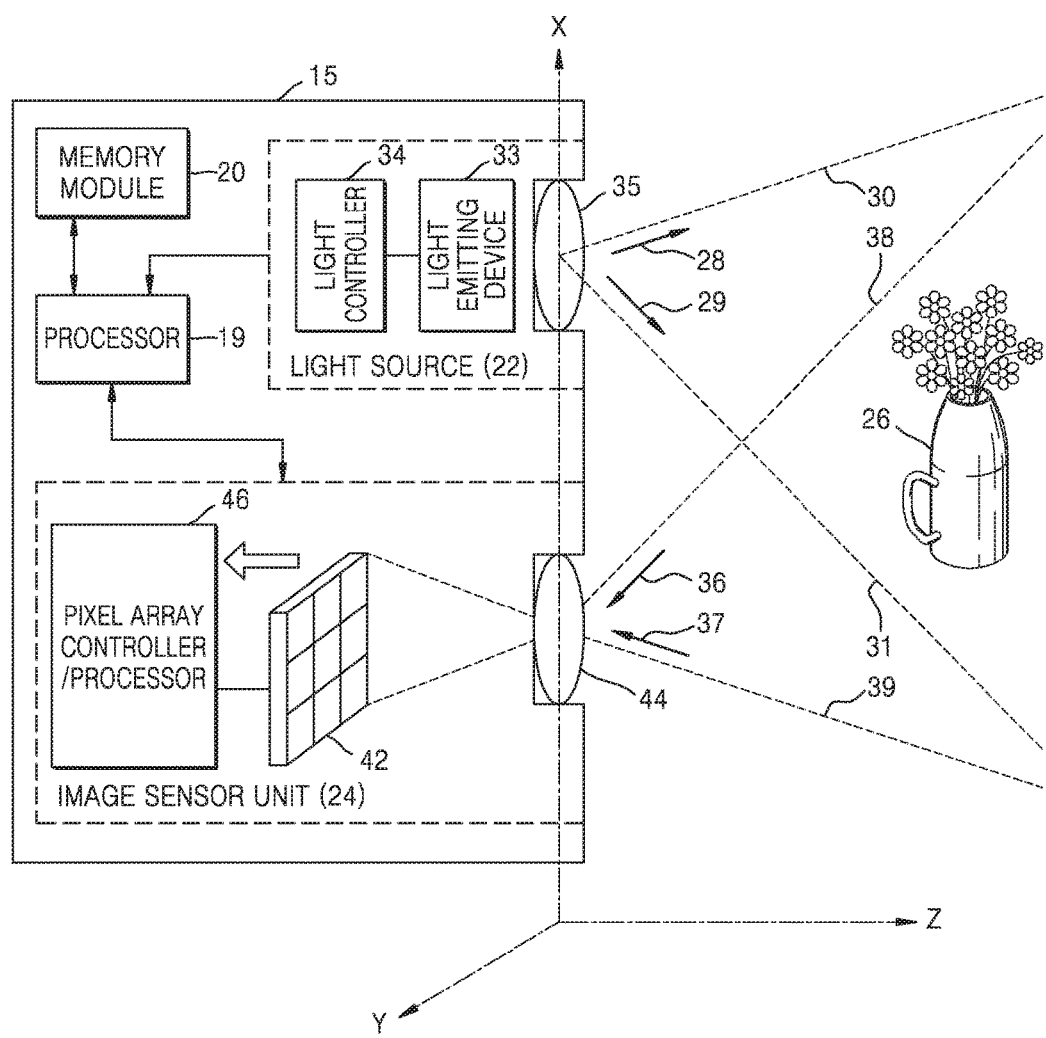
FIG. 2 is a diagram for explaining an operation of the system according to an embodiment.

FIG. 2 is a diagram for explaining an operation of the system 15 according to an embodiment.

Referring to FIG. 2, the system 15 may be used to obtain depth information about a 3D object 26, which may be an individual object or an object in a scene (not shown), in the Z-axis direction. In some embodiments, the depth information may be calculated by the processor 19 based on scan data received from the image sensor unit 24. In some embodiments, the depth information may be calculated by the image sensor unit 24. In some embodiments, the depth information may be used as a part of a 3D user interface by the processor 19 so that a user of the system 15 may interact with or use a 3D image of the 3D object 26 in a game or an application executed in the system 15.

The X-axis is a horizontal direction along a front surface of the system 15, the Y-axis is a vertical direction out of the page, and the Z-axis is a depth direction that may be oriented toward the 3D object 26 to be imaged. In some embodiments, optical axes of the light source 22 and the image sensor unit 24 may be parallel to the Z-axis in order to measure a depth.

The light source 22 may illuminate the 3D object 26 as marked by arrows 28 and 29. The arrows 28 and 29 respectively correspond to dashed lines 30 and 31 indicating paths of a light beam or light radiation. The light beam or the light radiation may be used to perform point scanning on the 3D object 26 within a wide viewing angle. Line-by-line scanning over a surface of an object is performed by using an optical radiation source that may be a light emitting device 33 operated and controlled by a light controller 34. A light beam from the light emitting device 33 may be point-scanned in X-Y directions over a surface of the 3D object 26 through a projection lens 35, under the control of the light controller 34. In some embodiments, during the point scanning, light spots may be projected to the surface of the 3D object 26 along a scan line. The projection lens 35 may be a concentration lens having a glass or plastic surface or a cylindrical optical element for concentrating a laser beam from the light emitting device 33 on one point on the surface of the 3D object 26. For example, the projection lens 35 may be a concentration lens having a convex structure. However, embodiments are not limited thereto, and another appropriate lens design may be selected for the projection lens 35. The 3D object 26 may be located at a focal point where illumination light from the light emitting device 33 is concentrated on a light spot by the projection lens 35. Accordingly, during the point scanning, a narrow area or a point on the surface of the 3D object 26 may be sequentially illuminated by a light beam concentrated by the projection lens 35.

In some embodiments, the light emitting device 33 may a laser diode or a light-emitting diode for emitting infrared or visible light, a NIR laser, a point light source, a white lamp, a monochromatic light source combined with a monochromator, or a combination of another laser source. The light emitting device 33 may be fixed at one position in a housing of the system 15 and may rotate in the X-Y directions. The light emitting device 33 may be controlled in the X-Y directions by the light controller 34, and may perform point scanning on the 3D object 26. In some embodiments, the visible light may be green light. Light emitted from the light emitting device 33 may be emitted to the surface of the 3D object 26 by using a mirror (not shown). Alternatively, the point scanning may be performed without a mirror. For example, the light source 22 may include fewer or more elements than those illustrated in FIG. 2.

Light reflected from the point scanning of the 3D object 26 may travel along light collecting paths marked by arrows 36 and 37 and dashed lines 38 and 39. As light from the light emitting device 33 is received through the light collecting paths, photons scattered by or reflected from the surface of the 3D object 26 may move. In FIG. 2, various paths marked by arrows and dashed lines are exemplary. Paths through which an optical signal actually travels are not limited to the illustrated paths.

Light received from the illuminated 3D object 26 may be concentrated on one or more pixels of a two-dimensional (2D) pixel array 42 by a collection lens 44 of the image sensor unit 24. Like the projection lens 35, the collection lens 44 may be a concentration lens having a glass or plastic surface or another cylindrical optical element for concentrating reflected light received from the 3D object 26 on one or more pixels of the 2D pixel array 42. In some embodiments, the collection lens 44 may be, but is not limited to, a concentration lens having a convex structure. Also, for convenience of explanation, the 2D pixel array 42 is a 3×3 pixel array in FIG. 2. However, it will be understood that the 2D pixel array 42 may include thousands or millions of pixels. The 2D pixel array 42 may be an RGB pixel array in which different pixels collect optical signals of different colors. The 2D pixel array 42 may be a 2D sensor such as a 2D RGB sensor including an infrared (IR) cut-off filter, a 2D IR sensor, a 2D NIR sensor, a 2D RGBW sensor, or a 2D RGB-IR sensor. The system 15 may use the 2D pixel array 42 not only for 3D imaging (including depth measurement) of the 3D object 26 but also for 2D RGB color imaging of the 3D object 26 (or a scene including the 3D object 26).

The 2D pixel array 42 may convert the received photons into electrical signals, and a pixel array controller/processor 46 may process the electrical signals to determine a 3D depth image of the 3D object 26. For example, the pixel array controller/processor 46 may combine and calculate phase information in order to measure a depth. The pixel array controller/processor 46 may include associated circuits for controlling an operation of the 2D pixel array 42.

The processor 19 may control operations of the light source 22 and the image sensor unit 24. For example, the system 15 may include a mode switch (not shown) that is controlled by the user and switches between a 2D imaging mode and a 3D imaging mode. When the user selects the 2D imaging mode by using the mode switch, the processor 19 may activate the image sensor unit 24 and may not activate the light source 221 because the 2D imaging mode uses ambient light. In contrast, when the user selects the 3D imaging mode by using the mode switch, the processor 19 may activate both the light source 22 and the image sensor unit 24, and may trigger a change in a level of a reset signal RST in the pixel array controller/processor 46 and may switch from a linear mode to a logarithmic mode when the ambient light is too strong and is not reflected in the linear mode. Processed image data received from the pixel array controller/processor 46 may be stored in the memory module 20 by the processor 19. The processor 19 may display a 2D or 3D image selected by the user on a display screen (not shown) of the system 15. The processor 19 may be programmed with software or firmware for performing the above-described various processing tasks. In some embodiments, the processor 19 may include programmable hardware logic circuits for performing some or all of the above functions. For example, the memory module 20 may store program code, a lookup table, or intermediate calculation results so that the processor 19 may perform a corresponding function.

The processor 19 of the system 15 may perform one-dimensional (1D) point scanning on the 3D object 26 along a scan line by using the light source 22. During the point scanning, the light source 22 may be controlled by the processor 19 to project successive light spots (or a series of light spots) to the surface of the 3D object 26 line by line. The pixel array controller/processor 46 of the system 15 may select one row of pixels in an image sensor such as the 2D pixel array 42. The image sensor such as the 2D pixel array 42 includes multiple pixels arranged in a 2D array that form an image plane. The selected row of pixels forms an epipolar line of the scan line in the image plane. Incidentally, an epipolar line is a line of intersection of an epipolar plane with an imaging plane, where the epipolar plane is defined by a 3D point and optical centres of two perspective cameras. The pixel array controller/processor 46 is controlled by the processor 19 to detect each light spot by using a corresponding pixel in the row of pixels. When light reflected from a light spot is concentrated on two or more neighbouring pixels by the collection lens 44, the light reflected from the light spot may be detected by a single pixel or one or more pixels. In other words, light reflected from two or more light spots may be collected in a single pixel of the 2D pixel array 42. The pixel array controller/processor 46 is controlled by the processor 19 to generate a pixel-specific output in response to pixel-specific detection of a corresponding light spot in the successive light spots. Accordingly, the pixel array controller/processor 46 may determine a 3D distance (or a depth) to a corresponding light spot on the surface of the 3D object 26, based on at least the pixel-specific output and a scan angle used by the light source 22 that projects the corresponding light spot.

Figure 3A:
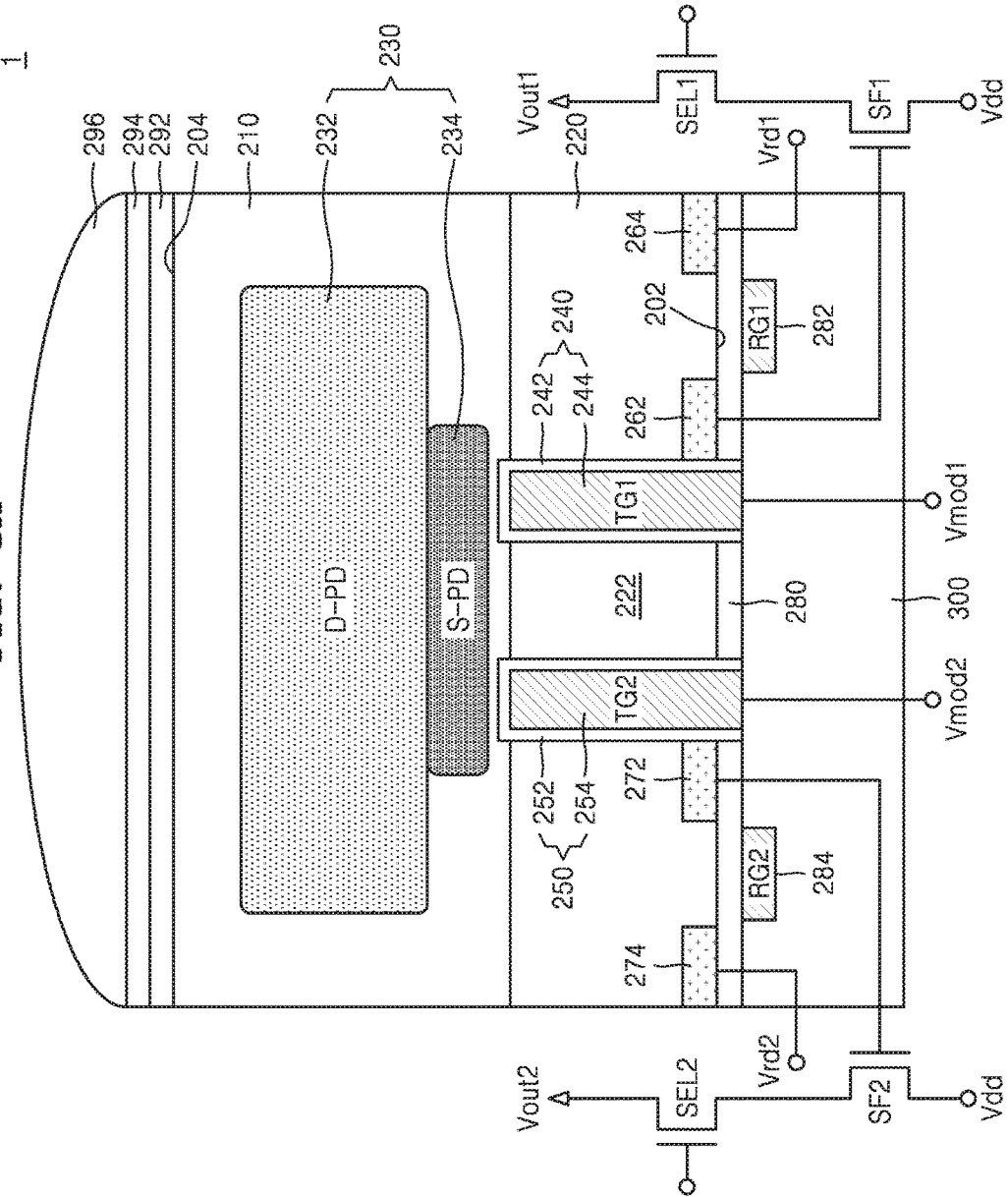
FIG. 3A is a cross-sectional view illustrating elements of a unit pixel of an image sensor according to an embodiment.
Figure 3B:
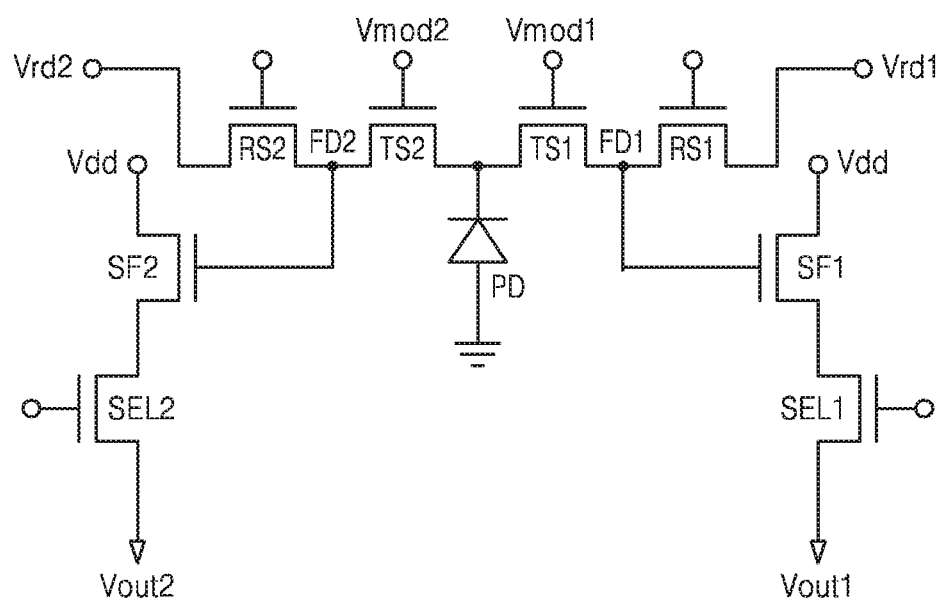
FIG. 3B is an equivalent circuit diagram of the unit pixel of the image sensor according to an embodiment.
Figure 3C:
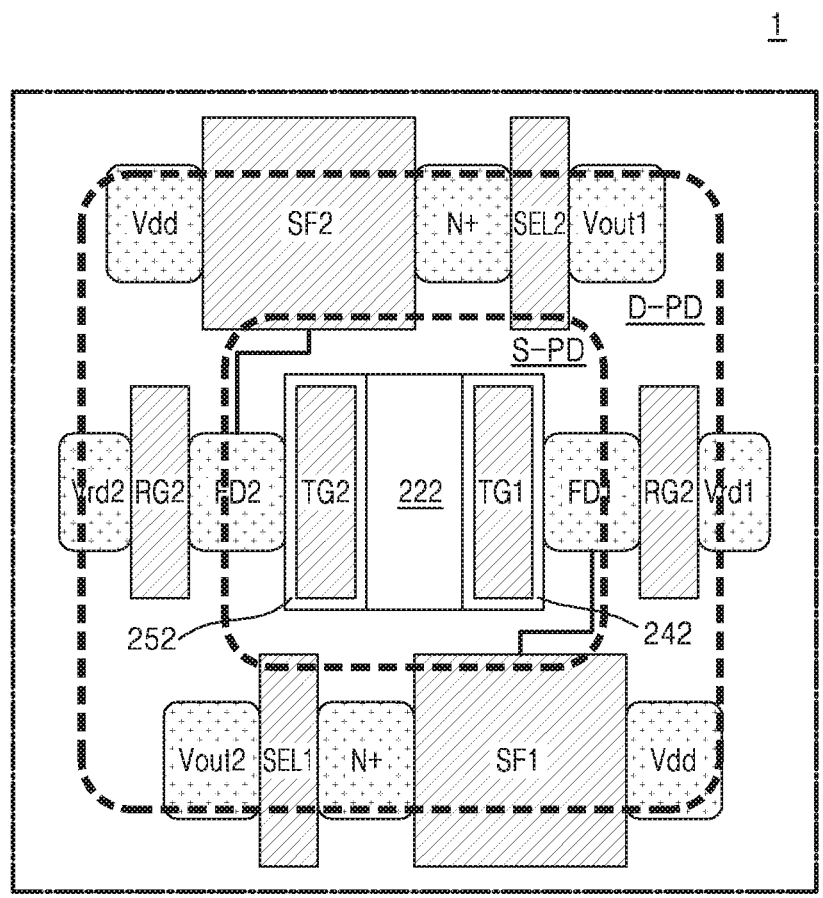
FIG. 3C is a plan view illustrating elements of the unit pixel of the image sensor according to an embodiment.

FIG. 3A is a cross-sectional view illustrating elements of a unit pixel of an image sensor 1 according to an embodiment. FIG. 3B is an equivalent circuit diagram of the unit pixel of the image sensor 1 according to an embodiment. FIG. 3C is a plan view illustrating elements of the unit pixel of the image sensor 1 according to an embodiment.

For convenience of explanation, a cross-sectional view and/or a plan view, and an equivalent circuit diagram are illustrated and explained together, and the same reference numerals are used in the cross-sectional view and/or the plan view, and the equivalent circuit diagram.

Referring to FIGS. 3A through 3C, the image sensor 1 includes a semiconductor substrate 210, a photoelectric conversion region 230, at least two vertical transfer gates, e.g., a first vertical transfer gate 244 and a second vertical transfer gate 254, and a wiring structure 300. The semiconductor substrate 210 has a first surface 202 and a second surface 204 that are opposite to each other, and a well region 220 adjacent to the first surface 202. The term "adjacent" as used herein may be taken to mean that two elements are adjoined such as by sharing a common side, but when specified or shown may also be taken to mean that two elements are proximate and without an intervening element of the image sensor therebetween. The photoelectric conversion region 230 is located in the semiconductor substrate 210 between the well region 220 and the second surface 204. The at least two vertical transfer gates, e.g., first vertical transfer gate 244 and second vertical transfer gate 254, are spaced apart from each other and extend in a thickness direction of the semiconductor substrate 210 that is perpendicular to each of the first surface 202 and the second surface 204 to pass through at least a part of the well region 220. The wiring structure 300 is located on the first surface 202 of the semiconductor substrate 210. The wiring structure 300 may include a first reset gate RG1 282, a second reset gate RG2 284, and a wiring, a contact plug, and an interlayer insulating film for forming associated circuits.

As shown in FIG. 3A, the first surface 202 and the second surface 204 are opposite to each other by being on opposite sides of the semiconductor substrate 210. The first surface 202 and the second surface 204 may be in parallel or substantially parallel (e.g., within 5 degrees of parallel) planes defining the opposite sides of the semiconductor substrate 210. The well region 220 may be adjacent to the first surface 202 by sharing part or all of the first surface 202 with the overall semiconductor substrate 210 as a side (i.e., border). The first vertical transfer gate 244 and the second vertical transfer gate 254 may extend in the thickness direction by having the longest of four sides shown in FIG. 3A extending in the depth direction. As shown in FIG. 3A, the first vertical transfer gate 244 and the second vertical transfer gate 254 may also extend beyond the first surface 202 in the depth direction so as to extend beyond the well region 220.

The semiconductor substrate 210 may include at least one selected from among, for example, silicon (Si), germanium (Ge), silicon germanium (SiGe), silicon carbide (SiC), gallium arsenide (GaAs), indium arsenide (InAs), and indium phosphide (InP). In some embodiments, the semiconductor substrate 210 may have a first conductivity type. For example, the first conductivity type may be a p-type.

The well region 220 may have, for example, the first conductivity type. The well region 220 may be formed by doping the semiconductor substrate 210 with impurities having the first conductivity type. An impurity concentration of the well region 220 may be greater than an impurity concentration of a portion of the semiconductor substrate 210 other than the well region 220.

The photoelectric conversion region 230 may have a second conductivity type. For example, the second conductivity type may be an n-type. The photoelectric conversion region 230 may constitute a photodiode (PD). The photoelectric conversion region 230 may include a first photoelectric conversion region 232 (D-PD) and a second photoelectric conversion region 234 (S-PD). An impurity concentration of the second photoelectric conversion region 234 (S-PD) may be greater than an impurity concentration of the first photoelectric conversion region 232 (D-PD). Since the first photoelectric conversion region 232 (D-PD) is formed relatively far from the first surface 202 of the semiconductor substrate 210 and the second photoelectric conversion region 234 (S-PD) is formed relatively close to the first surface 202 of the semiconductor substrate 210, the first photoelectric conversion region 232 (D-PD) and the second photoelectric conversion region 234 (S-PD) may be respectively referred to as a deep-photodiode (D-PD) and a shallow-photodiode (S-PD).

In a direction parallel to the first surface 202 or the second surface 204 of the semiconductor substrate 210, a width of the first photoelectric conversion region 232 (D-PD) may be greater than a width of the second photoelectric conversion region 234 (S-PD). The first photoelectric conversion region 232 (D-PD) may overlap all of the second photoelectric conversion region 234 (S-PD), for example, in the thickness direction of the semiconductor substrate 210. In other words, when viewed from the direction of the bottom of the page in FIG. 3A looking in the depth direction towards the top of the page, the first photoelectric conversion region 232 may have a cross-section that encompasses all of a cross-section of the second photoelectric conversion region 234. Stated even differently, in the horizontal direction the second photoelectric conversion region 234 has a width inside of the width of the first photoelectric conversion region 232 on both the left and the right in FIG. 3A. Thus, the term "overlap" as used is representative of a comparison between two comparable elements, such as a cross-sectional dimension of one element (e.g., the first photoelectric conversion region 232) encompassing a comparable cross-sectional dimension of another element (e.g., the second photoelectric conversion region 242). Accordingly, photo-charges generated in the photoelectric conversion region 230 may be concentrated by moving from the first photoelectric conversion region 232 (D-PD) that is relatively wide to the second photoelectric conversion region 234 (S-PD) that is relatively narrow.

Each of the at least two vertical transfer gates, e.g., the first vertical transfer gate 244 and second vertical transfer gate 254, may extend in the thickness direction of the semiconductor substrate 210 to have a length ranging from about 50 nm to about 500 nm. In some embodiments, a thickness of the well region 220 may be similar to the length of each of the at least two vertical transfer gates, e.g., the first vertical transfer gate 244 and second vertical transfer gate 254. In some embodiments, the at least two vertical transfer gates, e.g., the first vertical transfer gate 244 and second vertical transfer gate 254, may extend in the thickness direction of the semiconductor substrate 210 to completely pass through the well region 220.

The well region 220 may include a demodulation region 222. The demodulation region 222 in the well region 220 may be a region where photo-charges generated in the photoelectric conversion region 230 move due to the at least two vertical transfer gates, e.g., the first vertical transfer gate 244 and second vertical transfer gate 254. Accordingly, the demodulation region 222 may include portions of the well region 220 surrounding and adjacent to the at least two vertical transfer gates, e.g., the first vertical transfer gate 244 and second vertical transfer gate 254, for example, portions of the well region 220 adjacent to surfaces opposite to facing surfaces of the at least two vertical transfer gates, e.g., the first vertical transfer gate 244 and second vertical transfer gate 254. Nevertheless, for convenience of explanation, only a portion of the well region 220 between the at least two vertical transfer gates, e.g., the first vertical transfer gate 244 and second vertical transfer gate 254 that are spaced apart from each other, is referred to as the demodulation region 222. In other words, despite what is shown in FIG. 3A, the demodulation region 222 may also include portions of the well region 220 on the sides of the first vertical transfer gate 244 and second vertical transfer gate 254 that do not face one another. Accordingly, the at least two vertical transfer gates, e.g., the first vertical transfer gate 244 and second vertical transfer gate 254, may be spaced apart from each other with the demodulation region 222 therebetween. In some embodiments, the demodulation region 222 may have the first conductivity type. In some embodiments, the demodulation region 222 may have the first conductivity type, and may have an impurity concentration that is the same as that of other portions of the well region 220. In other embodiments, the demodulation region 222 may have an impurity concentration that is different from that of other portions of the well region 220. In other embodiments, the demodulation region 222 may have the second conductivity type.

A first transfer gate insulating film 242 and a second transfer gate insulating film 252 for insulating the at least two vertical transfer gates, e.g., the first vertical transfer gate 244 and second vertical transfer gate 254, and the well region 220 may be located around the at least two vertical transfer gates, e.g., the first vertical transfer gate 244 and second vertical transfer gate 254. When the image sensor 1 includes two vertical transfer gates, that is, the first vertical transfer gate 244 (TG1) and the second vertical transfer gate 254 (TG2), the first vertical transfer gate 244 and the first transfer gate insulating film 242 surrounding the first vertical transfer gate 244 may be referred to as a first transfer gate structure 240, and the second vertical transfer gate 254 and the second transfer gate insulating film 252 surrounding the second vertical transfer gate 254 may be referred to as a second transfer gate structure 250. A first modulation voltage Vmod1 and a second modulation voltage Vmod2 may be respectively applied to the first vertical transfer gate 244 and the second vertical transfer gate 254. The first vertical transfer gate 244 and the second vertical transfer gate 254 may respectively constitute a first transfer transistor TS1 and a second transfer transistor TS2.

The photoelectric conversion region 230 may overlap the demodulation region 222 in the thickness direction of the semiconductor substrate 210. In other words, when viewed from the direction of the bottom of the page in FIG. 3A looking in the depth direction towards the top of the page, the photoelectric conversion region 230 may have a cross-section that encompasses all of a cross-section of the demodulation region 222. Also, the photoelectric conversion region 230 may overlap each of the first transfer gate structure 240 including the first vertical transfer gate 244 and the second transfer gate structure 250 including the second vertical transfer gate 254 in the thickness direction of the semiconductor substrate 210. In other words, when viewed from the direction of the bottom of the page in FIG. 3A looking in the depth direction towards the top of the page, the photoelectric conversion region 230 may have a cross-section that encompasses all of cross-sections of the first transfer gate structure 240 and the second transfer gate structure 250. For example, the photoelectric conversion region 230 may overlap each of the demodulation region 222, the first transfer gate structure 240 including the first vertical transfer gate 244, and the second transfer gate structure 250 including the second vertical transfer gate 254 in the thickness direction of the semiconductor substrate 210. Stated differently, in the horizontal direction in FIG. 3A, the photoelectric conversion region 230 may extend both to the right and the left of the demodulation region 222, the first transfer gate structure 240, and the second transfer gate structure 250. The horizontal direction in FIG. 3A corresponds to a width direction as described herein.

In some embodiments, the second photoelectric conversion region 234 (S-PD) may overlap the demodulation region 222 in the thickness direction of the semiconductor substrate 210. Also, the second photoelectric conversion region 234 (S-PD) may overlap each of the first transfer gate structure 240 including the first vertical transfer gate 244 and the second transfer gate structure 250 including the second vertical transfer gate 254 in the thickness direction of the semiconductor substrate 210. The first photoelectric conversion region 232 (D-PD) may overlap, for example, each of the demodulation region 222, the first transfer gate structure 240 including the first vertical transfer gate 244, and the second transfer gate structure 250 including the second vertical transfer gate 254 in the thickness direction of the semiconductor substrate 210. Stated differently, in the horizontal direction in FIG. 3A, the second photoelectric conversion region 234 may extend both to the right and the left of the demodulation region 222, the first transfer gate structure 240, and the second transfer gate structure 250. Additionally, in the horizontal direction in FIG. 3A, the first photoelectric conversion region 232 may extend both to the right and the left of the demodulation region 222, the first transfer gate structure 240, and the second transfer gate structure 250.

Accordingly, photo-charges generated in the photoelectric conversion region 230 may be concentrated by moving from the first photoelectric conversion region 232 (D-PD) to the second photoelectric conversion region 234 (S-PD), and then may be transferred to the demodulation region 222.

A first charge storage region FD1 262 and a second charge storage region FD2 272 respectively located adjacent to the first vertical transfer gate 244 and the second vertical transfer gate 254 may be located in the well region 220 adjacent to the first surface 202. For example, the first charge storage region FD1 262 may share a planar or substantially planar (e.g., more than 90% planar) interface with the first transfer gate structure 240, and another planar or substantially planar (e.g., more than 90% planar) interface with the first surface 202. The second charge storage region FD2 272 may share a planar or substantially planar (e.g., more than 90% planar) interface with the second transfer gate structure 250, and another planar or substantially planar (e.g., more than 90% planar) interface with the first surface 202. The first charge storage region FD1 262 and the second charge storage region FD2 272 may be located in the well region 220 adjacent to the first surface 202 at sides of the first vertical transfer gate 244 and the second vertical transfer gate 254 that are opposite to the demodulation region 222. In detail, the first charge storage region FD1 262 may be located at a side of the first vertical transfer gate 244 that is opposite to (on the other side of the first vertical transfer gate 244 from) the second vertical transfer gate 254, and the second charge storage region FD2 272 may be located at a side of the second vertical transfer gate 254 that is opposite to (on the other side of the second vertical transfer gate 254 from) the first vertical transfer gate 244.

The first charge storage region FD1 262 and the second charge storage region FD2 272 may be respectively connected to gates of a first source follower transistor SF1 and a second source follower transistor SF2. A source and a drain of the first source follower transistor SF1 may be respectively connected to a source of a first selection transistor SEL1 and a voltage supply Vdd. A first output voltage Vout1 may be output from a drain of the first selection transistor SEL1. A source and a drain of the second source follower transistor SF2 may be respectively connected to a source of a second selection transistor SEL2 and a voltage supply Vdd. A second output voltage Vout2 may be output from a drain of the second selection transistor SEL2. The sources of the first source follower transistor SF1 and second source follower transistor SF2 and the first selection transistor SEL1 and second selection transistor SEL2 may be regions denoted by N+ in FIG. 3C.

In some embodiments, the gates of the first source follower transistor SF1 and second source follower transistor SF2 and the first selection transistor SEL1 and second selection transistor SEL2 may be located at a level that is the same as that of the first reset gate RG1 282 and second reset gate 284 in the wiring structure 300. In some embodiments, the sources and the drains of the first source follower transistor SF1 and second source follower transistor SF2 and the first selection transistor SEL1 and second selection transistor SEL2 may be located at a level that is the same as that of the first charge storage region FD1 262 and the second charge storage region FD2 272 in the well region 220.

The first reset gate RG1 282 and the second reset gate RG2 284 may be located on the first surface 202 of the semiconductor substrate 210 at sides of the first charge storage region FD1 262 and the second charge storage region FD2 272 that are opposite to the first vertical transfer gate 244 and the second vertical transfer gate 254. That is, the first reset gate RG1 282 may be on an opposite side of the first charge storage region FD1 262 from the first vertical transfer gate 244. The second reset gate RG2 284 may be on an opposite side of the second charge storage region FD2 272 from the second vertical transfer gate 254. The first reset gate RG1 282 and the second reset gate 284 may respectively constitute a first reset transistor RS1 and a second reset transistor RS2.

A gate insulating film 280 may be located between the first surface 202 of the semiconductor substrate 210 and the first reset gate RG1 282 and the second reset gate 284. Although the gate insulating film 280 covers most of the first surface 202 of the semiconductor substrate 210 in FIG. 3A, embodiments are not limited thereto. In some embodiments, the gate insulating film 280 may be located only between the first surface 202 of the semiconductor substrate 210 and the first reset gate RG1 282 and the second reset gate 284.

A first reset impurity region 264 and a second reset impurity region 274 may be located in the well region 220 adjacent to the first surface 202 at sides of the first reset gate RG1 282 and the second reset gate 284 that are opposite to the first charge storage region FD1 262 and the second charge storage region FD2 272. As shown, the first reset impurity region 264 may share a planar or substantially planar (e.g., more than 90% planar) edge with the first surface 202 and another planar or substantially planar (e.g., more than 90% planar) edge with the image sensor 1. The second reset impurity region 274 may share a planar or substantially planar (e.g., more than 90% planar) edge with the first surface 202 and another planar or substantially planar (e.g., more than 90% planar) edge with the image sensor 1. A first reset drain voltage Vrd1 and a second reset drain voltage Vrd2 may be respectively applied to the first reset impurity region 264 and the second reset impurity region 274. In some embodiments, the first reset drain voltage Vrd1 and the second reset drain voltage Vrd2 may have the same potential.

The image sensor 1 further includes a microlens 296 located on the second surface 204 of the semiconductor substrate 210. Accordingly, the second surface 204 of the semiconductor substrate 210 may be a surface on which light is incident. At least one of a negative fixed charge layer 292 and an anti-reflection layer 294 may be located between the microlens 296 and the second surface 204 of the semiconductor substrate 210. In some embodiments, the negative fixed charge layer 292, the anti-reflection layer 294, and the microlens 296 may be sequentially stacked on the second surface 204 of the semiconductor substrate 210, so that each interfaces the next such as with a planar or substantially planar interface. In some embodiments, the negative fixed charge layer 292 may directly contact the second surface 204 of the semiconductor substrate 210 and may cover the second surface 204 of the semiconductor substrate 210. In some embodiments, a buffer layer or a color filter layer (not shown) may be further located between the microlens 296 and the anti-reflection layer 294.

The negative fixed charge layer 292 may be formed of a material having a high dielectric constant such as $HfO_x$, $AlO_x$, or $ZrO_x$. The anti-reflection layer 294 may be formed of, for example, SiON, SiC, SIGN, or SiCO. The color filter layer may transmit light incident through the microlens 296 therethrough and may allow only light having a necessary wavelength to be incident through the second surface 204 into the photoelectric conversion region 230.

The image sensor 1 according to the present disclosure may include the at least two vertical transfer gates, e.g., the first vertical transfer gate 244 and second vertical transfer gate 254, and may have a backside illumination (BSI) structure. Accordingly, since a pixel of the image sensor 1 may be miniaturized and the first vertical transfer gate TG1 and second vertical transfer gate TG2 of the first transfer transistor TS1 and second transfer transistor TS2 may be relatively long, the demodulation performance and the sensitivity per unit area of the image sensor 1 may be improved.

Figure 4A:
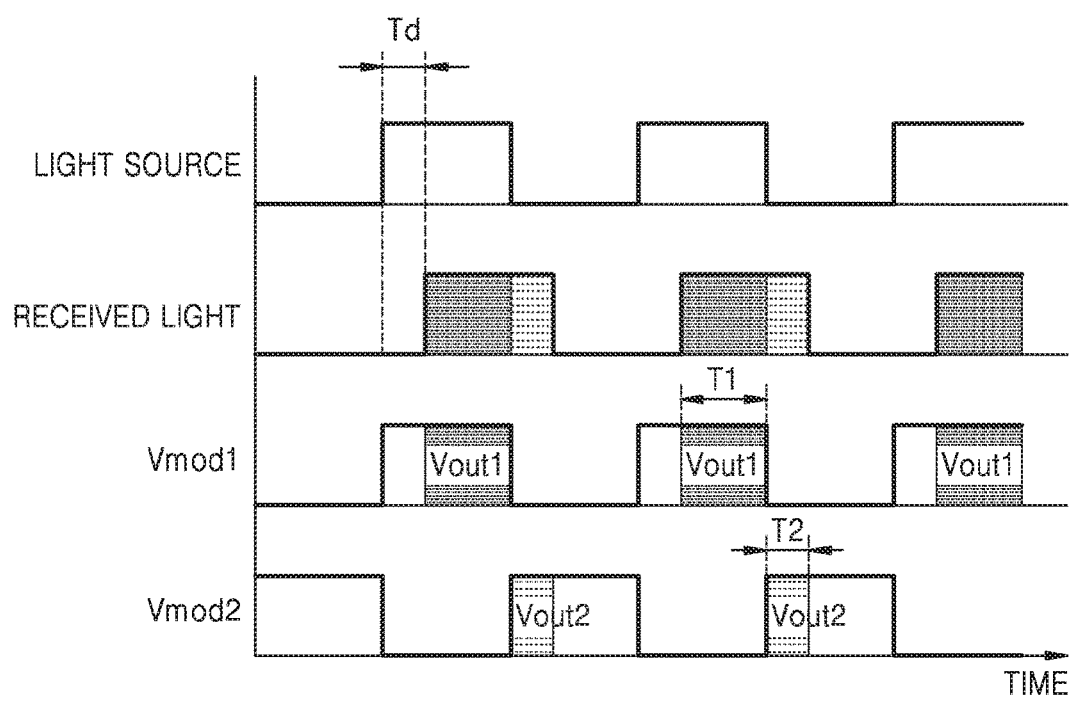
FIG. 4A is a timing diagram for explaining an operation of the image sensor for measuring a distance according to an embodiment.
Figure 4B:
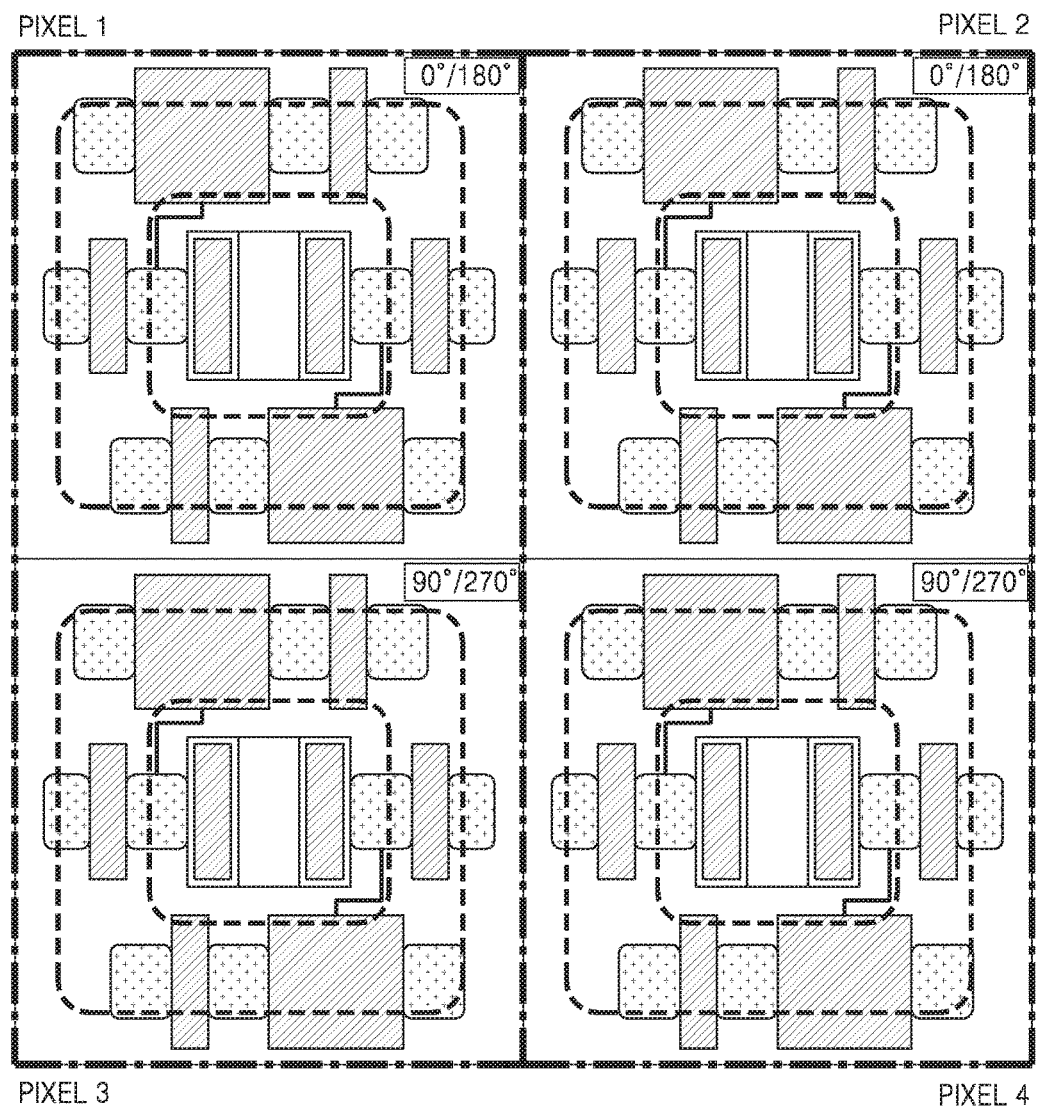
FIG. 4B is a plan view of a pixel array of the image sensor according to an embodiment.
Figure 4C:
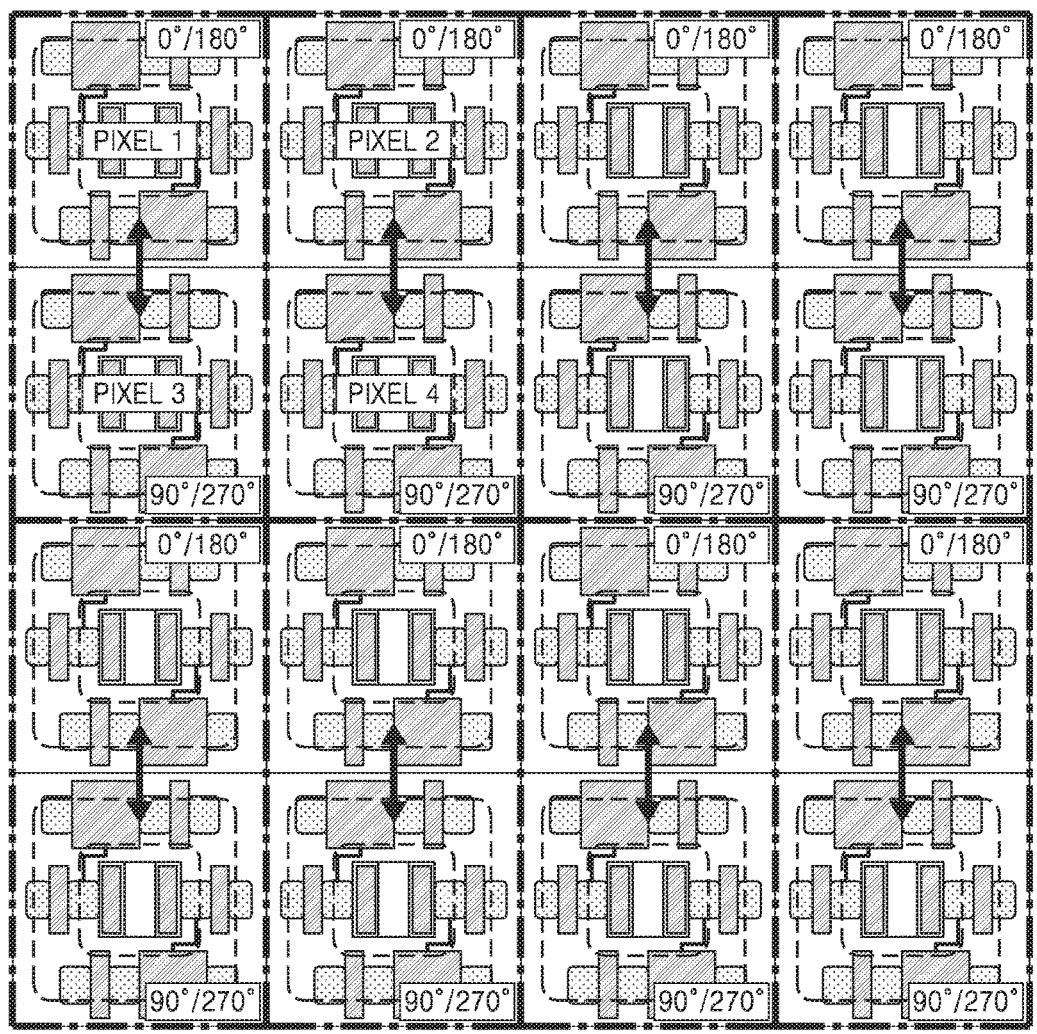
FIGS. 4C and 4D are plan views of the pixel array for explaining an operation of the image sensor for measuring a distance according to an embodiment.
Figure 4D:
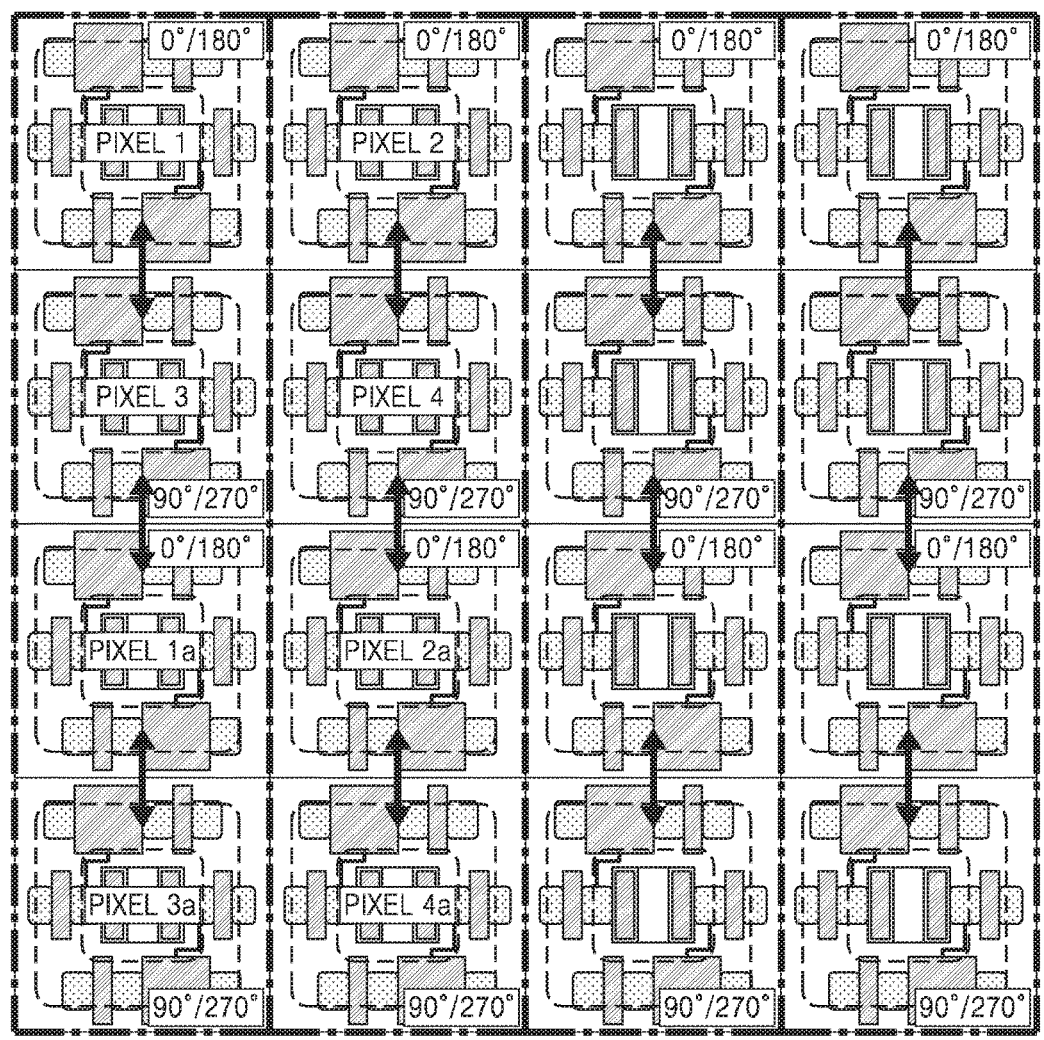

FIG. 4A is a timing diagram for explaining an operation of the image sensor 1 for measuring a distance according to an embodiment. FIG. 4B is a plan view of a pixel array of the image sensor 1 according to an embodiment. FIGS. 4C and 4D are plan views of the pixel array for explaining an operation of the image sensor 1 for measuring a distance according to an embodiment.

Referring to FIG. 4A, output light from the light source 22 (see FIG. 2) and reflected light reflected by the 3D object 26 (see FIG. 2) and received by the image sensor 1 (see FIG. 3A) may have a delay time Td. The output light may be a pulse optical signal according to a pulse voltage. In some embodiments, the pulse optical signal may have a frequency ranging from about 10 MHz to about 100 MHz.

The first modulation voltage Vmod1 applied to the first vertical transfer gate TG1 (see FIG. 3A) may be a pulse voltage synchronized with the pulse optical signal. The second modulation voltage Vmod2 applied to the second vertical transfer gate TG2 (see FIG. 3A) may be a pulse voltage having a predetermined phase difference from the pulse optical signal. In some embodiments, the phase difference may be about 180°.

As a difference (T1−T2) between a time T1 during which a pulse signal of the reflected light and a pulse voltage of the first vertical transfer gate TG1 overlap each other and a time T2 during which the pulse signal of the reflected light and a pulse voltage of the second vertical transfer gate TG2 overlap each other increases, a measured distance decreases. The first output voltage Vout1 may be generated during the time T1 where the pulse signal of the reflected light and the pulse voltage of the first vertical transfer gate TG1 overlap each other, and the second output voltage Vout2 may be generated during the time T2 where the pulse signal of the reflected light and the pulse voltage of the second vertical transfer gate TG2 overlap each other. Accordingly, a distance between the image sensor 1 and the 3D object 26 may be determined by analyzing a difference between the first output voltage Vout1 and the second output voltage Vout2, for example, by using a 2-phase algorithm. The first output voltage Vout1 and the second output voltage Vout2 may be expressed by using a sum of multiple reflected light pulse signals as well as a single reflected light pulse signal.

In some embodiments, a distance between the image sensor 1 and the 3D object 26 may be determined by analyzing, by using a 4-phase algorithm, the first output voltage Vout1 and the second output voltage Vout2 obtained by applying a pulse voltage synchronized with the pulse optical signal and a pulse voltage having a phase difference of 180° from the pulse optical signal as the first modulation voltage Vmod1 and second modulation voltage Vmod2 and the first output voltage Vout1 and the second output voltage vout2 additionally obtained by applying a pulse voltage having a phase difference of 90° and a pulse voltage having a phase difference of 270° from the pulse optical signal as the first modulation voltage Vmod1 and second modulation voltage Vmod2.

Referring to FIGS. 4B and 4C, reflected light having phases of 0° and 180° may be collected in a first pixel, i.e., PIXEL 1, and reflected light having phases of 90° and 270° may be collected in a third pixel, i.e., PIXEL 3. For example, in the first pixel, i.e., PIXEL1, the first modulation voltage Vmod1 (see FIG. 4A) may be a pulse voltage synchronized with a pulse optical signal and the second modulation voltage Vmod2 (see FIG. 4A) may be a pulse voltage having a phase difference of 180° from the pulse optical signal. Also, in the third pixel, i.e., PIXEL 3, the first modulation voltage Vmod1 may be a pulse voltage having a phase difference of 90° from the pulse optical signal and the second modulation voltage Vmod2 may be a pulse voltage having a phase difference of 270° from the pulse optical signal. In this case, a distance between the image sensor 1 and the 3D object 26 may be determined by analyzing, by using a 4-phase algorithm, the first output voltage Vout1 and second output voltage Vout2 (see FIG. 3A) of the first pixel, i.e., PIXEL 1 and the third pixel, i.e., PIXEL 3. Likewise, a distance between the image sensor 1 and the 3D object 26 may be determined by analyzing, by using a 4-phase algorithm, the first output voltage Vout1 and second output voltage Vout2 of the other two pixels, that is, the second pixel, i.e., PIXEL 2 and the fourth pixel, i.e., PIXEL 4. That is, one distance information may be obtained from two pixels.

Referring to FIG. 4D, a distance may be determined by analyzing the first output voltage Vout1 and second output voltage Vout2 of the first pixel, i.e., PIXEL 1 and the third pixel, i.e., PIXEL 3 and analyzing the first output voltage Vout1 and second output voltage Vout2 of the third pixel, i.e., PIXEL 3 and another first pixel, i.e., PIXEL 1a. That is, the first output voltage Vout1 and second output voltage Vout2 of the third pixel, i.e., PIXEL 3 may be used to analyze the first output voltage Vout1 and second output voltage Vout2 of the first pixel, i.e., PIXEL 1 and to analyze the first output voltage Vout1 and second output voltage Vout2 of the other first pixel, i.e., PIXEL 1a. Also, the other first pixel, i.e., PIXEL 1a may be used to analyze the third pixel, i.e., PIXEL 3 and to analyze another third pixel, i.e., PIXEL 3a. Likewise, the fourth pixel, i.e., PIXEL 4 may be used to analyze the second pixel, i.e., PIXEL 2 and another second pixel, i.e., PIXEL 2a, and the other second pixel, i.e., PIXEL 2a may be used to analyze another fourth pixel, i.e., PIXEL 4a.

Accordingly, considering the entire pixel array, since one distance information may be obtained from one pixel, a resolution for the distance information may be increased.

Figure 5A:
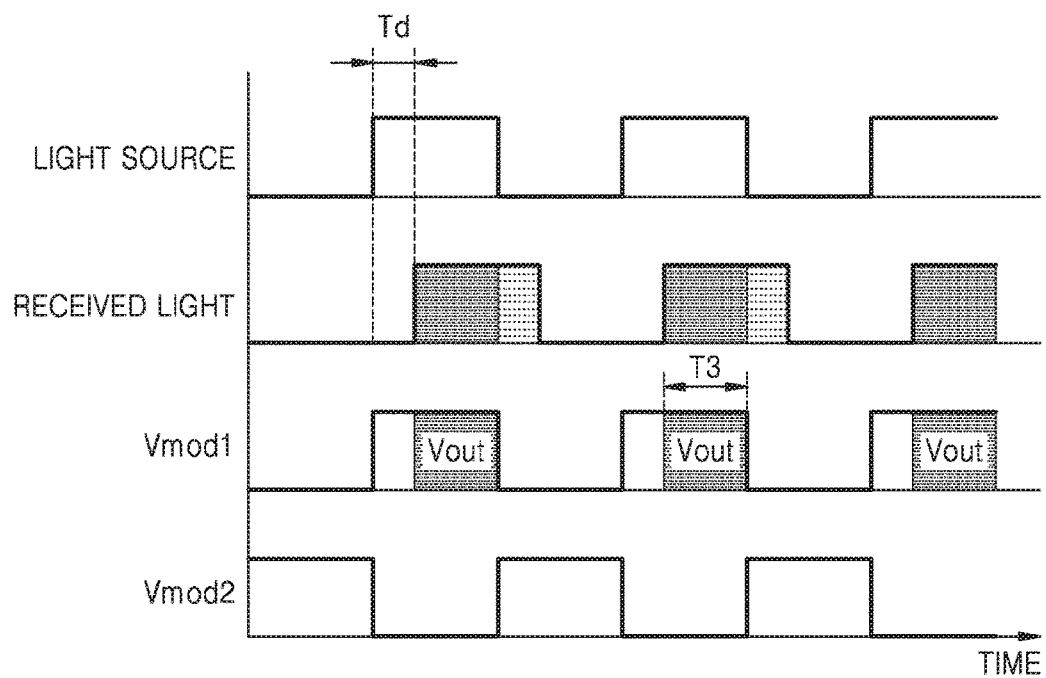
FIG. 5A is a timing diagram for explaining an operation of the image sensor for measuring a distance according to an embodiment.
Figure 5B:
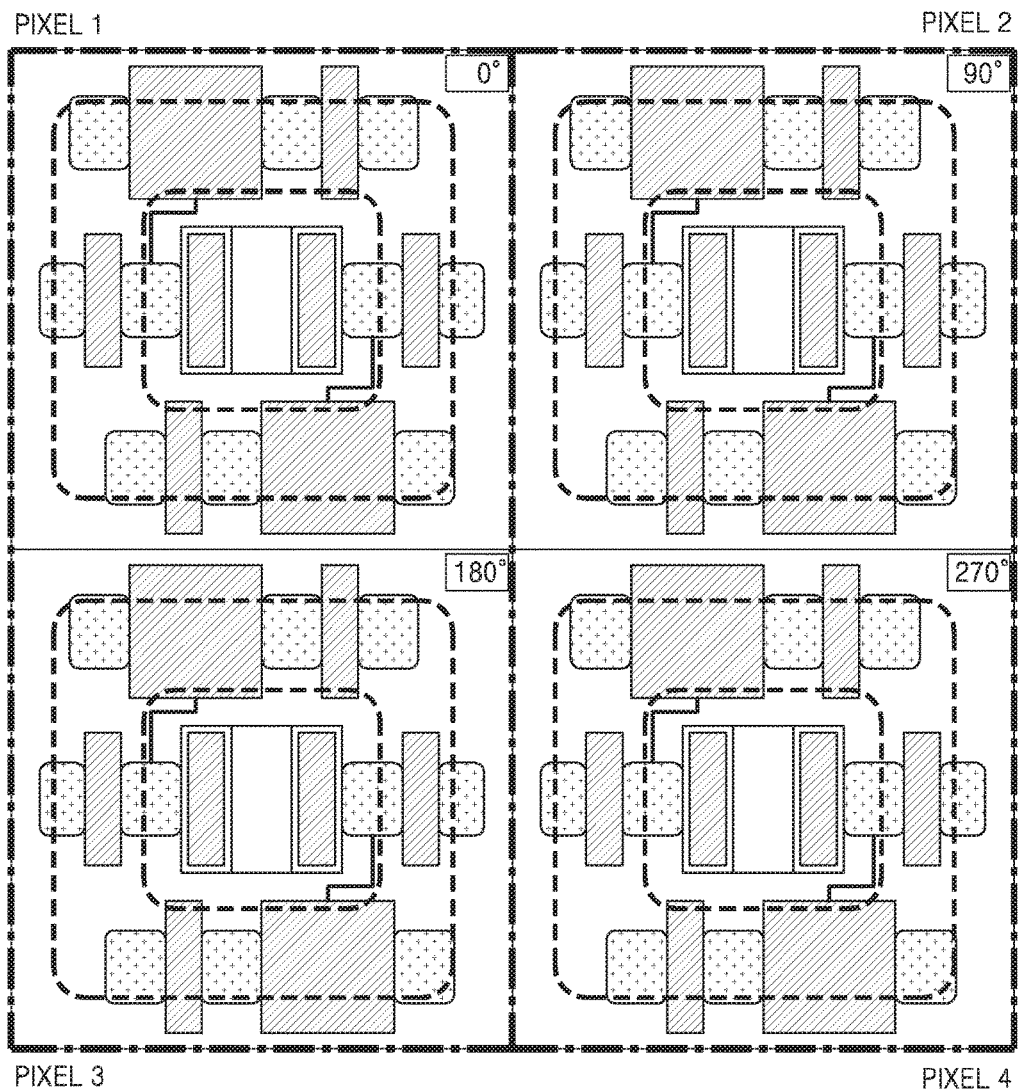
FIG. 5B is a plan view of a pixel array of the image sensor according to an embodiment.
Figure 5C:
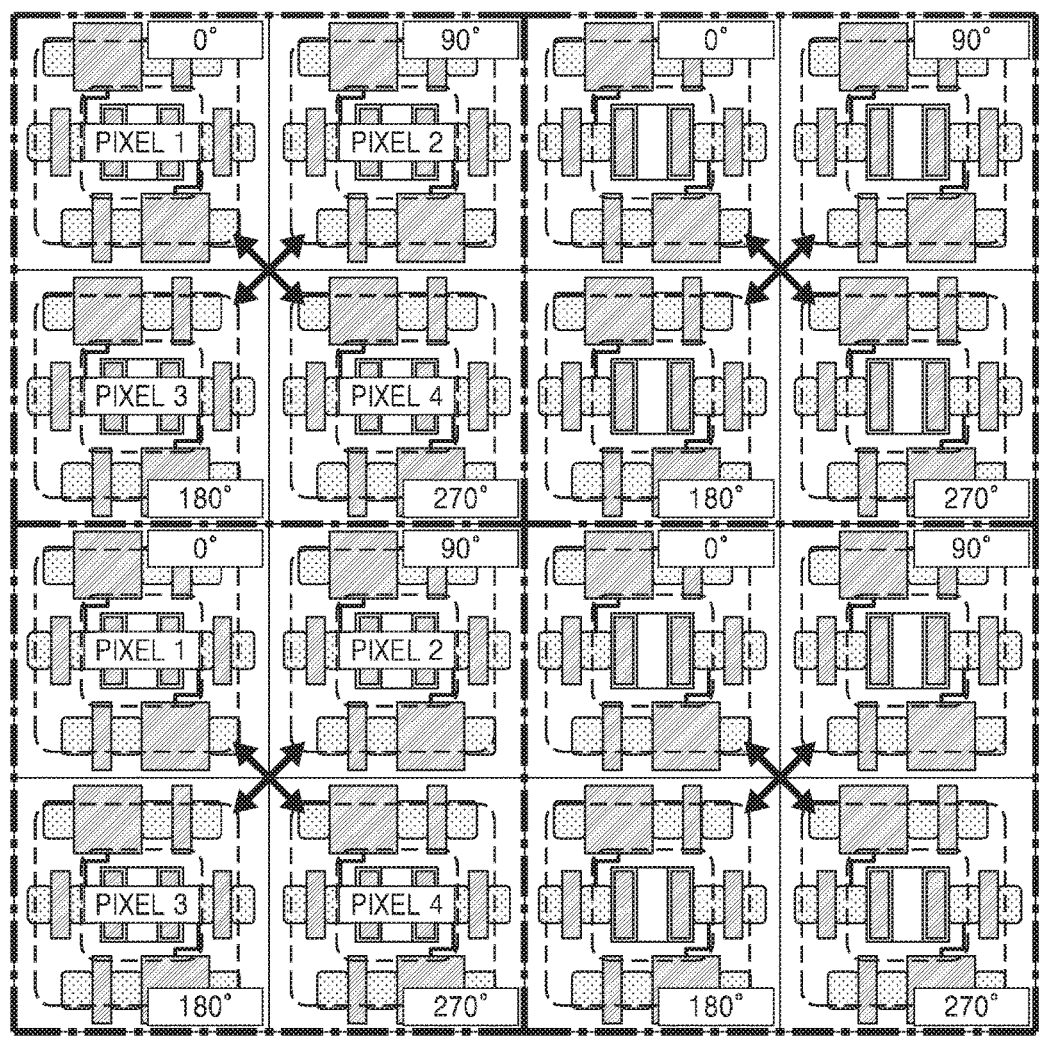
FIGS. 5C and 5D are plan views of the pixel array for explaining an operation of the image sensor for measuring a distance according to an embodiment.
Figure 5D:
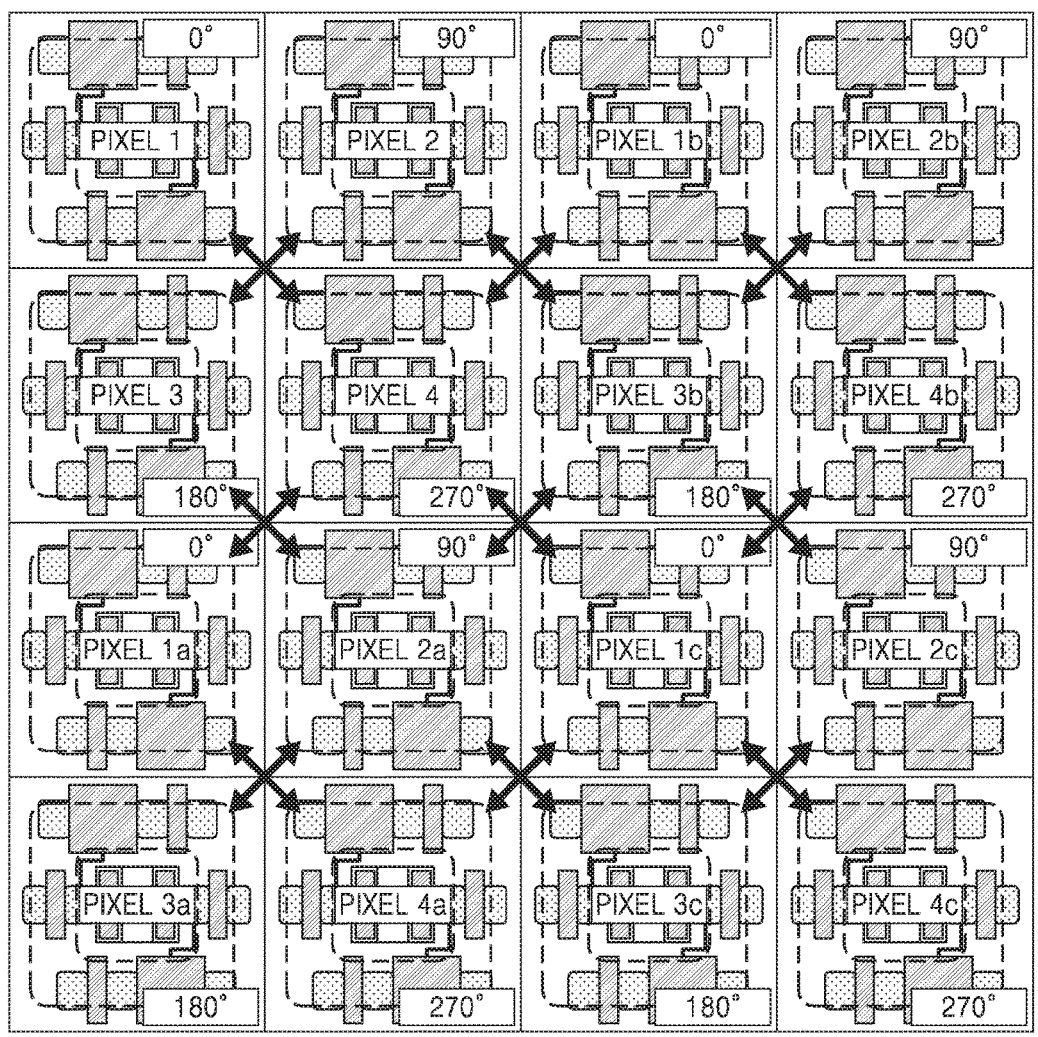

FIG. 5A is a timing diagram for explaining an operation of the image sensor 1 for measuring a distance according to an embodiment. FIG. 5B is a plan view of a pixel array of the image sensor 1 according to an embodiment. FIGS. 5C through 5D are plan views of the pixel array for explaining an operation of the image sensor 1 for measuring a distance according to an embodiment.

FIGS. 5A through 5D are views for explaining an operation of the image sensor 1 for measuring a distance when the second reset transistor RS2, the second source follower transistor SF2, and the second selection transistor SEL2 do not operate and only the first reset transistor RS1, the first source follower transistor SF1, and the first selection transistor SEL1 operate in the image sensor 1 of FIG. 3A.

Referring to FIG. 5A, output light from the light source 22 (see FIG. 2) and reflected light reflected by the 3D object 26 (see FIG. 2) and received by the image sensor 1 (see FIG. 3A) may have a delay time Td. The output light may be a pulse optical signal according to a pulse voltage. A distance between the image sensor 1 and the 3D object 26 may be determined by sequentially applying a pulse voltage synchronized with the pulse optical signal, a pulse voltage having a phase difference of 90° from the pulse optical signal, a pulse voltage having a phase difference of 180° from the pulse optical signal, and a pulse voltage having a phase difference of 270° from the pulse optical signal to the first vertical transfer gate TG1 (see FIG. 3A) and analyzing, by using a 4-phase algorithm, the first output voltages Vout generated during a time T3 where a pulse signal of the reflected light and a pulse voltage of the first vertical transfer gate TG1 overlap each other. The first output voltages Vout may be expressed by using a sum of multiple reflected light pulse signals as well as a single reflected light pulse signal. The second modulation voltage Vmod2 applied to the second vertical transfer gate TG2 (see FIG. 3A) may be a pulse voltage having a phase difference of 180° from the first modulation voltage Vmod1.

In some embodiments, a distance between the image sensor 1 and the 3D object 26 may be determined by sequentially applying a pulse voltage synchronized with the pulse optical signal and a pulse voltage having a phase difference of 180° from the pulse optical signal as the first modulation voltage Vmod1 to the first vertical transfer gate TG1 and analyzing, by using a 2-phase algorithm, the first output voltages Vout generated during the time T3 where a pulse signal of reflected light and a pulse voltage of the first vertical transfer gate TG1 overlap each other. The first output voltages Vout may be expressed by using a sum of multiple reflected light pulse signals as well as a single reflected light pulse signal.

Referring to FIGS. 5B and 5C, reflected light having a phase of 0° may be collected in the first pixel, i.e., PIXEL 1, reflected light having a phase of 90° may be collected in the second pixel, i.e., PIXEL 2, reflected light having a phase of 180° may be collected in the third pixel, i.e., PIXEL 3, and reflected light having a phase of 270° may be collected in the fourth pixel, i.e., PIXEL 4. In this case, a distance between the image sensor 1 and the 3D object 26 may be determined by analyzing, by using a 4-phase algorithm, the first output voltages Vout1 (see FIG. 3A) of the first through fourth pixels, i.e., PIXEL 1, PIXEL 2, PIXEL 3, and PIXEL 4. That is, one distance information may be obtained from four pixels.

Referring to FIG. 5D, a distance between the image sensor 1 and the 3D object 26 may be determined by analyzing, by using a 4-phase algorithm, the first output voltages Vout1 (see FIG. 3A) of four neighbouring pixels such as PIXEL 1, PIXEL 2, PIXEL 3, and PIXEL 4; PIXEL 1b, PIXEL 2, PIXEL 3b, and PIXEL 4; or PIXEL 1a, PIXEL 2a, PIXEL 3, and PIXEL 4. That is, one distance information may be obtained from one pixel.

Although not shown, a distance may be determined by analyzing first output voltages of two pixels by using a 2-phase algorithm in some embodiments, and in this case, one distance information may be obtained from two pixels or one pixel.

FIGS. 6A through 6E are cross-sectional views illustrating elements of a unit pixel of an image sensor 1a according to an embodiment. The same elements as those in FIG. 3A will not be repeatedly explained in FIGS. 6A through 6E.

Figure 6A:
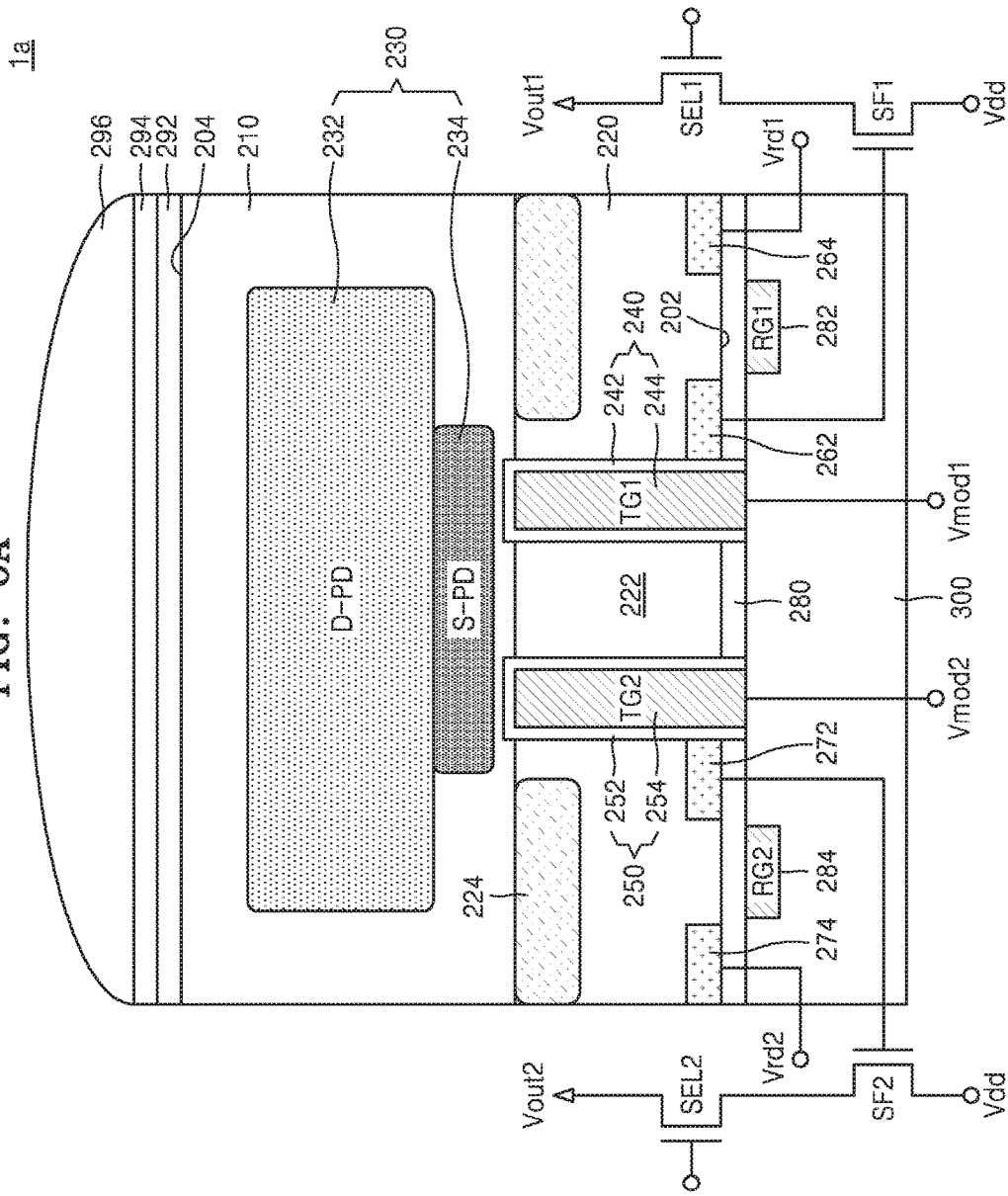

Referring to FIG. 6A, the image sensor 1a may further include first barrier impurity regions 224 located on portions of the well region 220 adjacent to the photoelectric conversion region 230. In detail, portions of the first barrier impurity regions 224 may be adjacent to a boundary line of the well region 220 that is opposite to (i.e., on the opposite side of the well region 220 from) the first surface 202. The first barrier impurity regions 224 may be respectively spaced apart from the first transfer gate structure 240 and second transfer gate structure 250.

The first barrier impurity regions 224 may have the first conductivity type. In some embodiments, an impurity concentration of the first barrier impurity regions 224 may be greater than an impurity concentration of the well region 220. The first barrier impurity regions 224 may prevent photo-charges generated in the photoelectric conversion region 230 from moving. Accordingly, photo-charges generated in the photoelectric conversion region 230 may be concentrated by moving to the first transfer gate structure 240 and second transfer gate structure 250 and the demodulation region 222.

Figure 6B:
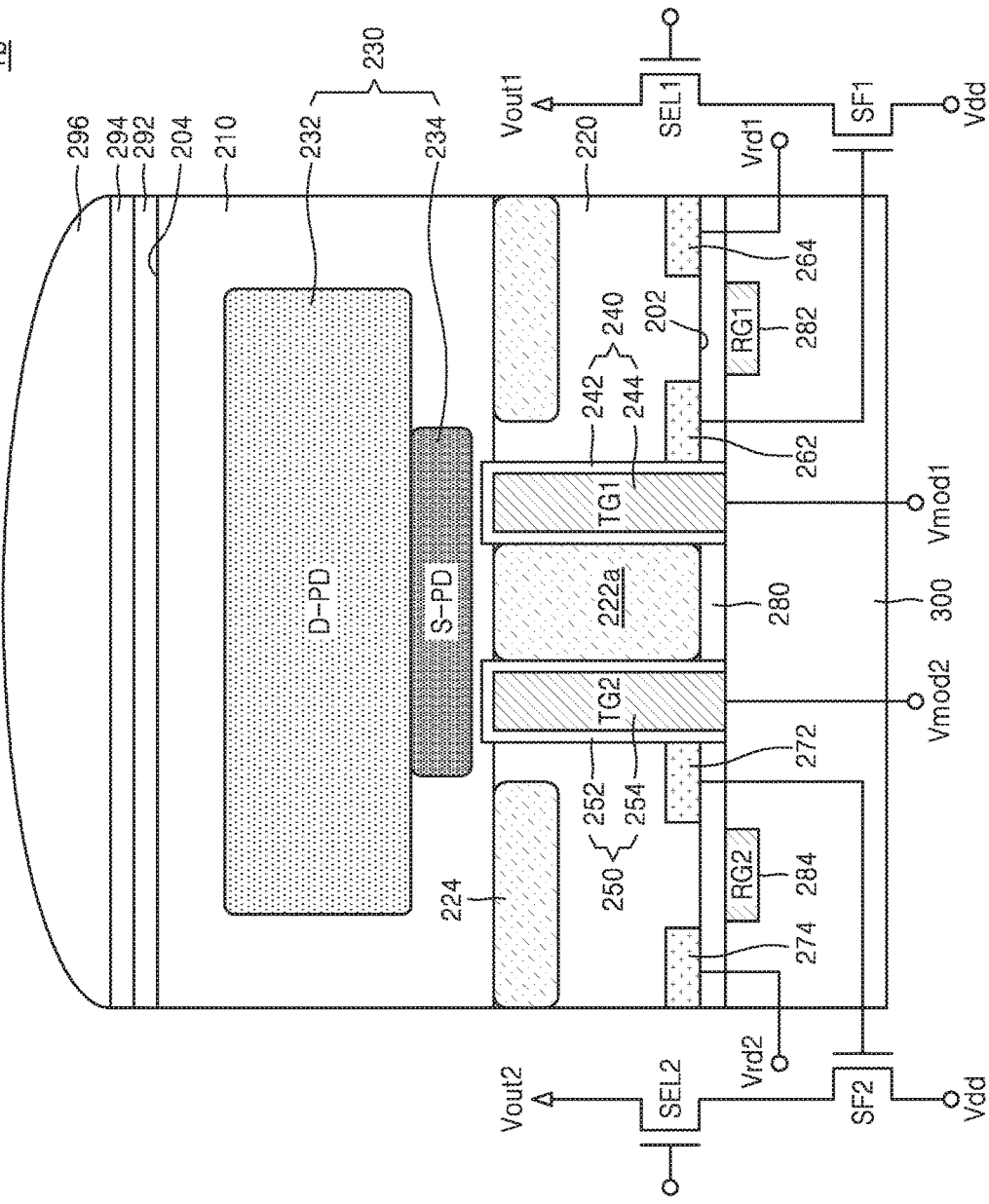

Referring to FIG. 6B, an image sensor 1b may include a sub-well region 222a located at a position corresponding to the demodulation region 222 (see FIG. 3A). The sub-well region 222a may have the first conductivity type. In some embodiments, an impurity concentration of the sub-well region 222a may be greater than an impurity concentration of the well region 220.

The sub-well region 222a may prevent photo-charges from being trapped between the first vertical transfer gate 244 and the second vertical transfer gate 254 or may prevent photo-charges from moving to an undesired position. Since the sub-well region 222a performs the same function as that of the demodulation region 222, the sub-well region 222a may be referred to as a demodulation region.

Although the image sensor 1b includes the first barrier impurity regions 224 in FIG. 6B, embodiments are not limited thereto and the first barrier impurity regions 224 may be omitted.

Referring to FIG. 6C, an image sensor 1c may include a second barrier impurity region 226 located on a portion of the demodulation region 222 adjacent to the first surface 202. The second barrier impurity region 226 in FIG. 6C is on the demodulation region 222, and the demodulation region 222 is a portion of the well region 220, but the second barrier impurity region 226 is not an element of the well region 220 in FIG. 6C.

The second barrier impurity region 226 may have the first conductivity type. In some embodiments, an impurity concentration of the second barrier impurity region 226 may be greater than an impurity concentration of the well region 220. In some embodiments, an impurity concentration of the second barrier impurity region 226 may be greater than an impurity concentration of the demodulation region 222.

The second barrier impurity region 226 may enable photo-electrons moved by the at least two vertical transfer gates, e.g., the first vertical transfer gate 244 and second vertical transfer gate 254, to be rapidly stored in the first charge storage region FD1 262 and the second charge storage region FD2 272.

Referring to FIG. 6D, an image sensor 1d may include a demodulation region 222b and the second barrier impurity region 226. The demodulation region 222b may have the second conductivity type. In some embodiments, an impurity concentration of the demodulation region 222b may be less than an impurity concentration of the photoelectric conversion region 230.

The demodulation region 222b having the second conductivity type may enable photo-charges to be gathered on a central portion of the demodulation region 222b from an interface between the demodulation region 222b and the first transfer gate structure 240 and second transfer gate structure 250. Accordingly, the possibility that photo-charges are trapped and lost at the interface between the first transfer gate structure 240 and second transfer gate structure 250 and the demodulation region 222b may be minimized.

Referring to FIG. 6E, an image sensor 1e includes the semiconductor substrate 210 having a second surface 204a that is uneven. In some embodiments, the semiconductor substrate 210 may have multiple recesses 212, which are sunk toward the first surface 202, in the second surface 204a. Scattering induction layers 214 may be respectively located in the multiple recesses 212. The negative fixed charge layer 292 may surround the scattering induction layers 214 and may cover the second surface 204a of the semiconductor substrate 210. Accordingly, the scattering induction layers 214 may be spaced apart from the second surface 204a of the semiconductor substrate 210. As shown in FIG. 6E, the negative fixed charge layer 292 may be between scattering induction layers 214. The scattering induction layers 214 may be formed of an insulating material such as oxide.

A deep trench insulator structure 320 (DTI structure) may be located between multiple pixels of the image sensor 1e. The DTI structure 320 may be located in the semiconductor substrate 210 to surround the photoelectric conversion region 230, in particular, the first photoelectric conversion region 232 (D-PD). The DTI structure 320 may extend from the second surface 204a of the semiconductor substrate 210 to the first surface 202. In some embodiments, the DTI structure 320 may extend from the second surface 204a of the semiconductor substrate 210 to the first surface 202 to be spaced apart from the well region 220. The DTI structure 320 may be formed of an insulating material such as oxide, nitride, oxynitride, or a combination thereof. In some embodiments, the DTI structure 320 may include a conductive material layer 322 and a cover insulating layer 324 surrounding the conductive material layer 322. The conductive material layer 322 may be formed of, for example, polysilicon, metal, or metal nitride. The cover insulating layer 324 may be formed of an insulating material including oxide, nitride, oxynitride, or a combination thereof.

Part L1 of light incident into the image sensor 1e through the microlens 296 may travel to the photoelectric conversion region 230. Another part L2 of the light incident into the image sensor 1e through the microlens 296 may be scattered by the scattering induction layers 214 and then may be reflected again by the DTI structure 320. Accordingly, the number of optical paths of the light L2 may be increased and an absorptance of the photoelectric conversion region 230 may be increased.

The image sensor 1e may further include a rear reflective layer 310 located on the wiring structure 300. Light L3 that is not absorbed by the photoelectric conversion region 230 may be reflected by the rear reflective layer 310 to the photoelectric conversion region 230 again, and may be absorbed by the photoelectric conversion region 230.

At least some of the scattering induction layers 214, the DTI structure 320, and the rear reflective layer 310 of FIG. 6E may be applied to the image sensors 1a, 1b, 1c, and 1d of FIGS. 6A through 6D.

Figure 7B:
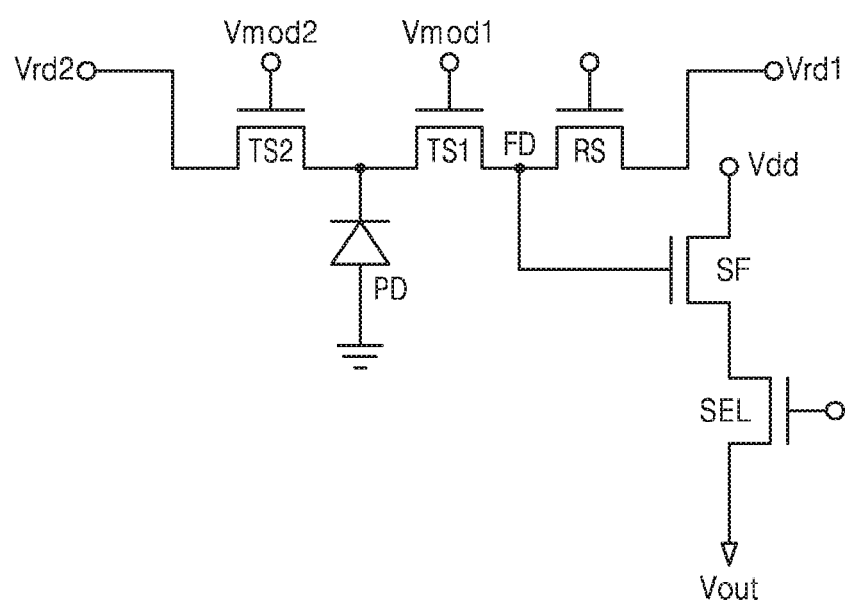
FIG. 7B is an equivalent circuit diagram of the unit pixel of the image sensor according to an embodiment.
Figure 7C:
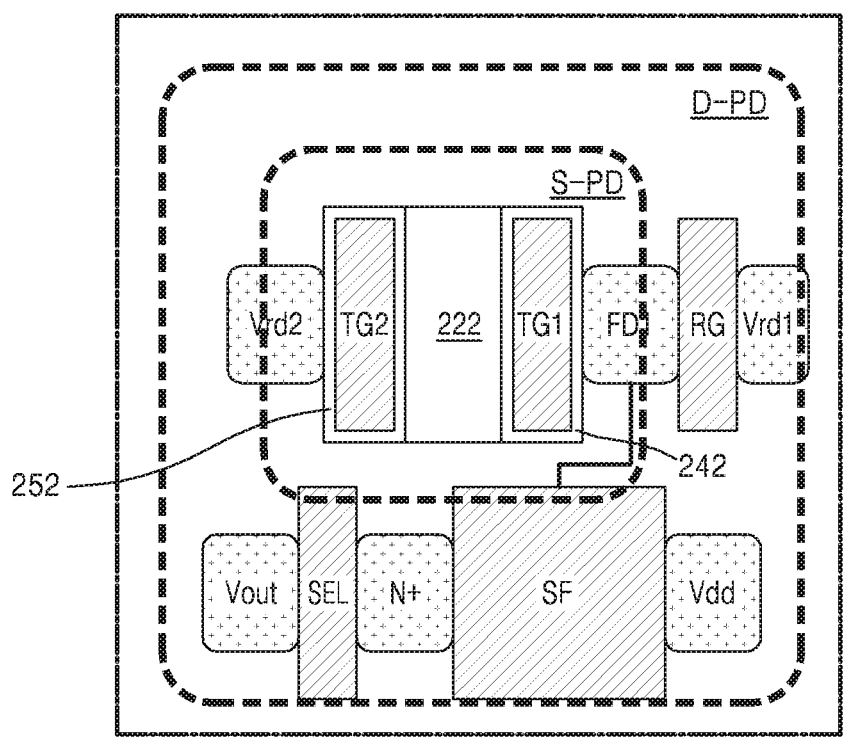
FIG. 7C is a plan view illustrating elements of the unit pixel of the image sensor according to an embodiment.

FIG. 7A is a cross-sectional view illustrating elements of a unit pixel of an image sensor 2 according to an embodiment. FIG. 7B is an equivalent circuit diagram of the unit pixel of the image sensor 2 according to an embodiment. FIG. 7C is a plan view illustrating elements of the unit pixel of the image sensor 2 according to an embodiment. The same elements as those in FIGS. 3A through 6E will not be repeatedly explained in FIGS. 7A through 7C.

Referring to FIGS. 7A through 7C, the image sensor 2 includes the semiconductor substrate 210 including the well region 220, the photoelectric conversion region 230, the at least two vertical transfer gates, e.g., the first vertical transfer gate 244 and second vertical transfer gate 254, the wiring structure 300, a first reset gate RG1 282, a first reset impurity region 264, the first charge storage region FD1 262, and the second charge storage region FD2 272. The first charge storage region FD1 262 may be connected to a gate of a source follow transistor SF. A source and a drain of the source follower transistor SF may be connected to a source of a selection transistor SEL and a voltage supply Vdd. An output voltage Vout may be output from a drain of the selection transistor SEL. The first reset gate RG1 282 may constitute a reset transistor RS. A first reset drain voltage Vrd1 and a second reset drain voltage Vrd2 may be respectively applied to the first reset impurity region 264 and the second charge storage region 272. In some embodiments, the first rest drain voltage Vrd1 and the second reset drain voltage Vrd2 may have the same potential.

An operation of the image sensor 2 may be substantially the same as that of the image sensor 1 of FIG. 3A when the second reset transistor RS2, the second source follower transistor SF2, and the second selection transistor SEL2 do not operate and only the first reset transistor RS1, the first source follower transistor SF1, and the first selection transistor SEL1 operate as described with FIGS. 5A through 5D, and thus a detailed explanation thereof will not be given.

That is, the image sensor 2 may not include the second reset transistor RS2, the second source follower transistor SF2, and the second selection transistor SEL2 that do not operate in the image sensor 1, and may include the reset transistor RS, the source follower transistor SF, and the selection transistor SEL respectively corresponding to the first rest transistor RS1, the first source follower transistor SF1, and the first selection transistor SEL1 that operate in the image sensor 1.

Figure 8:
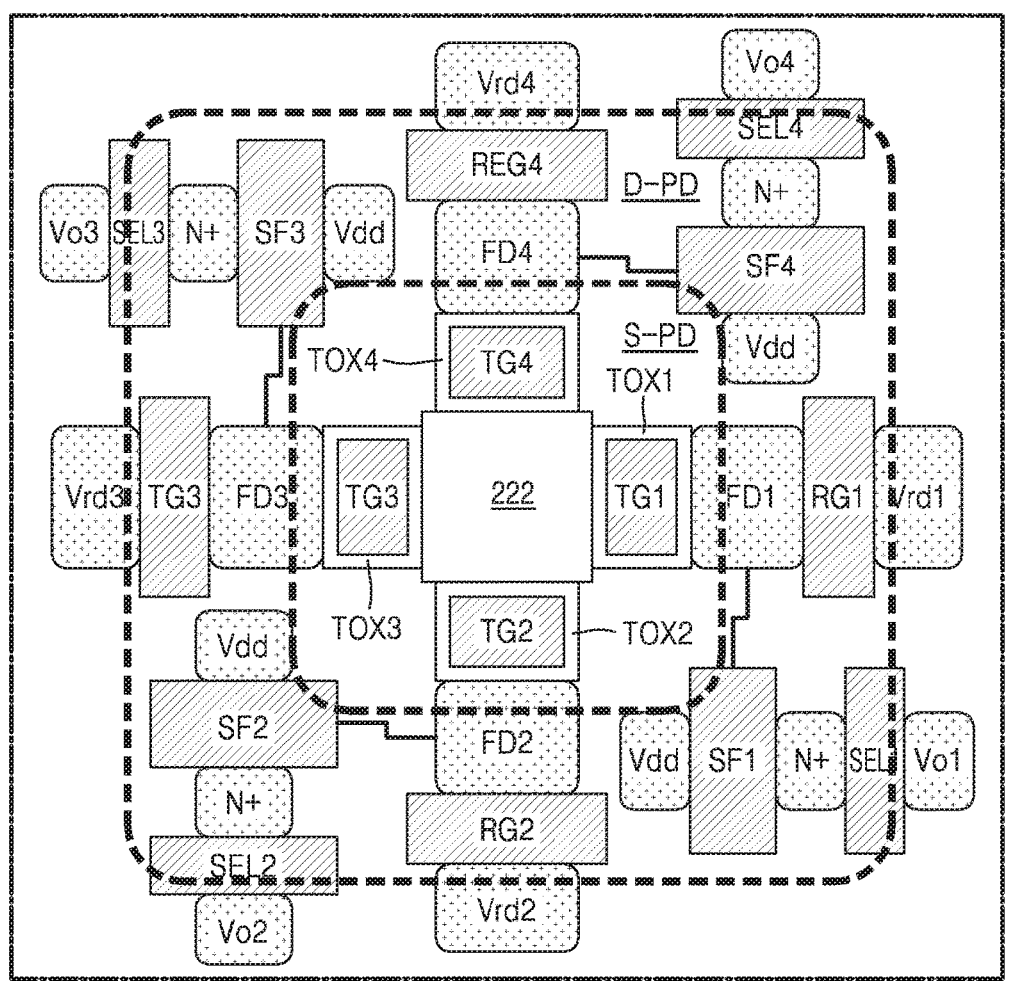
FIG. 8 is a plan view illustrating elements of a unit pixel of an image sensor according to an embodiment.

FIG. 8 is a plan view illustrating elements of a unit pixel of an image sensor 3 according to an embodiment.

Referring to FIG. 8, the image sensor 3 includes four vertical transfer gates, i.e., first through fourth vertical transfer gates TG1, TG2, TG3, and TG4 that are spaced apart from one another and extend in a thickness direction of the semiconductor substrate 210 (see FIG. 3A). The first through fourth vertical transfer gates TG1, TG2, TG3, and TG4 may be spaced apart from one another with the demodulation region 222 therebetween (i.e., between any two of the first through fourth vertical transfer gates TG1, TG2, TG3, TG4). First through fourth transfer gate insulating films TOX1, TOX2, TOX3, and TOX4 may be respectively located around the first through fourth vertical transfer gates TG1, TG2, TG3, and TG4. First through fourth charge storage regions FD1, FD2, FD3, and FD4, first through fourth reset gates RG1, RG2, RG3, and RG4, impurity regions to which first through fourth reset drain voltages Vrd1, Vrd2, Vrd3, and Vrd4 are applied, first through fourth source follower transistors SF1, SF2, SF3, and SF4, and first through fourth selection transistors SEL1, SEL2, SEL3, and SEL4 may be located to correspond to the first through fourth vertical transfer gates TG1, TG2, TG3, and TG4. First through fourth output voltages Vo1, Vo2, Vo3, and Vo4 may be respectively output from drains of the first through fourth selection transistors SEL1, SEL2, SEL3, and SEL4.

A cross-sectional view of the image sensor 3 taken along the first vertical transfer gate TG1 and the third vertical transfer gate TG3, or the second vertical transfer gate TG2 and the fourth vertical transfer gate TG4 is substantially the same as that of the image sensor 1 of FIG. 3A, and thus a detailed explanation thereof will not be given.

In the image sensor 3, a pulse voltage synchronized with a pulse optical signal, a pulse voltage having a phase difference of 90° from the pulse optical signal, a pulse voltage having a phase difference of 180° from the pulse optical signal, and a pulse voltage having a phase difference of 270° from the pulse optical signal may be respectively applied to the first through fourth vertical transfer gates TG1, TG2, TG3, and TG4. Accordingly, the image sensor 3 may determine a distance between the image sensor 3 and the 3D object 26 (see FIG. 2) by analyzing, by using a 4-phase algorithm, the first through fourth output voltages Vo1, Vo2, Vo3, and Vo4 obtained from one pixel.

Figure 9A:
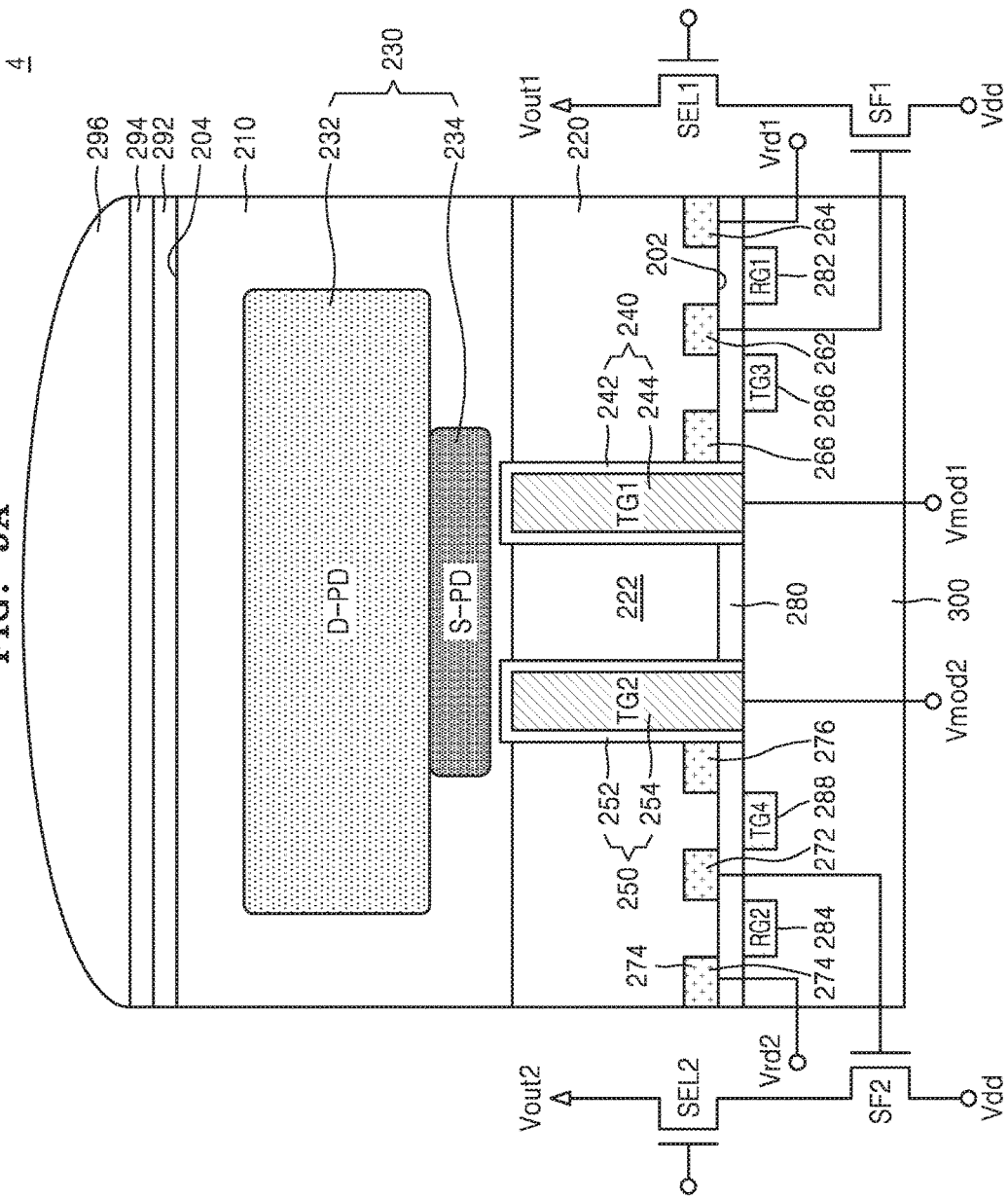
FIG. 9A is a cross-sectional view illustrating elements of a unit pixel of an image sensor according to an embodiment.
Figure 9B:
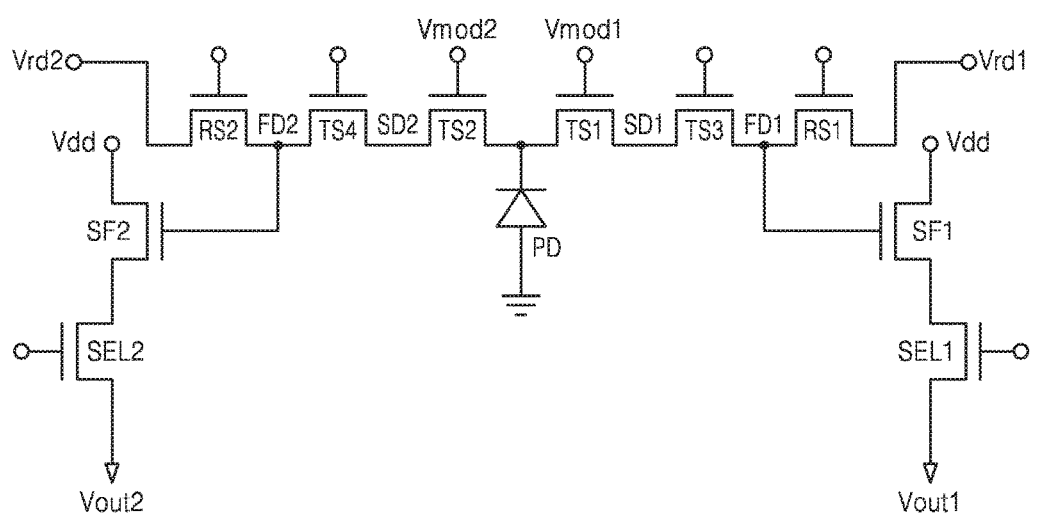
FIG. 9B is an equivalent circuit diagram of the unit pixel of the image sensor according to an embodiment.

FIG. 9A is a cross-sectional view illustrating elements of a unit pixel of an image sensor 4 according to an embodiment. FIG. 9B is an equivalent circuit diagram of the unit pixel of the image sensor 4 according to an embodiment. The same elements as those in FIGS. 3A and 3B will not be repeatedly explained in FIGS. 9A and 9B.

Referring to FIGS. 9A and 9B, the image sensor 4 further includes a first storage diffusion region SD1 266 and a second storage diffusion region SD2 276 located in the well region 220 adjacent to the first surface 202. The first storage diffusion region SD1 is between the first charge storage region FD1 262 and the first vertical transfer gate 244. The second storage diffusion region SD2 276 is between the second charge storage region FD2 272 and the second vertical transfer gate 254. The image sensor 4 further includes a first horizontal transfer gate TG3 286 and a second horizontal transfer gate (TG4) 288 located on the first surface 202 of the semiconductor substrate 210. The first horizontal transfer gate TG3 286 is located between the first charge storage region FD1 262 and the first storage diffusion region SD1 266 in the width direction, and offset in the depth direction. The second horizontal transfer gate TG4 288 is located between the second charge storage region 272 and the second storage diffusion region 276 in the width direction, and offset in the depth direction.

The first charge storage region FD1 262 and the second charge storage region FD2 272 may be respectively connected to gates of the first source follower transistor SF1 and the second source follower transistor SF2.

Since the image sensor 4 further includes the first storage diffusion region SD1 266 and second storage diffusion region 276 and the first horizontal transfer gate TG3 286 and second horizontal transfer gate 288, the image sensor 4 may function as a global shutter. Also, since the image sensor 4 includes four transfer gates including the first vertical transfer gate 244 and second vertical transfer gate 254 and the first horizontal transfer gate TG3 286 and second horizontal transfer gate 288, noise may be reduced.

Figure 10A:
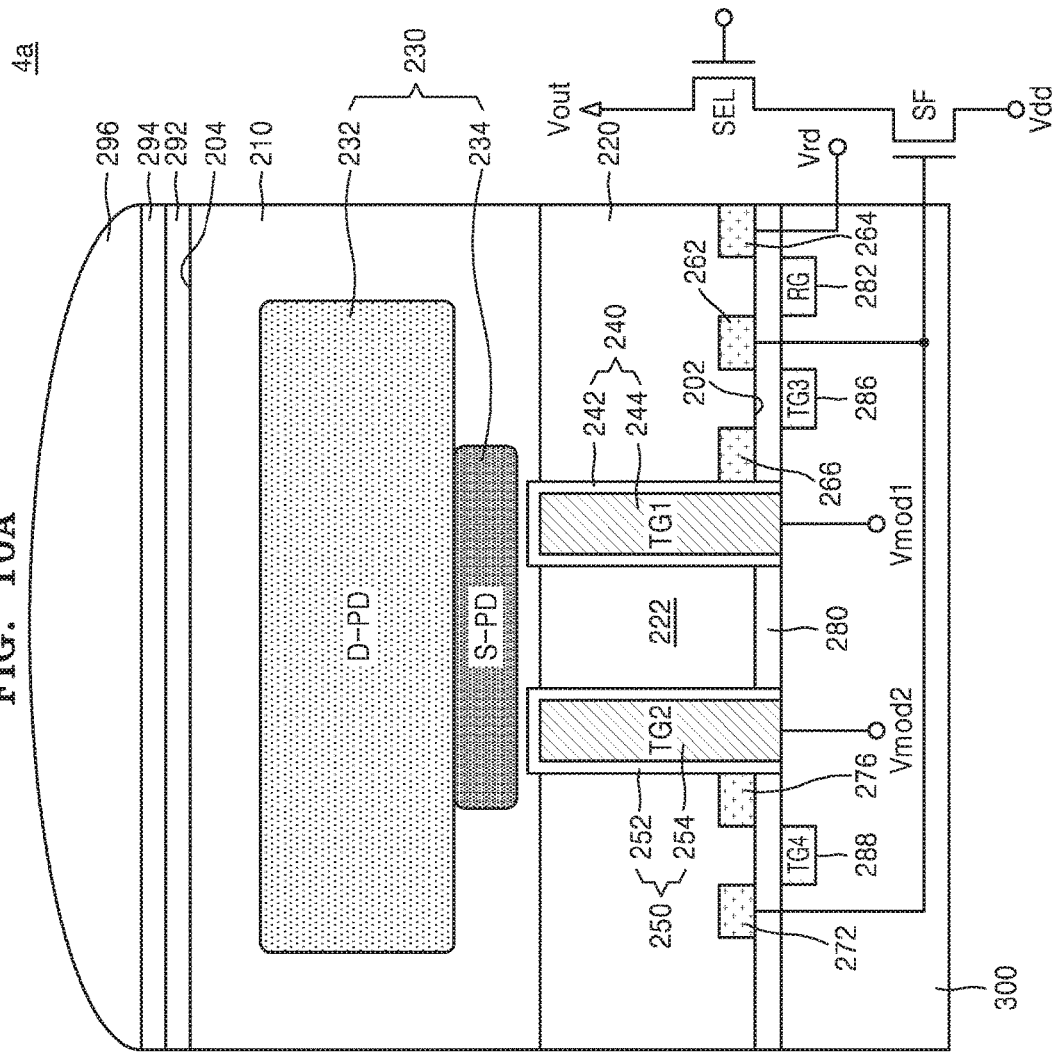
FIG. 10A is a cross-sectional view illustrating elements of a unit pixel of an image sensor according to an embodiment.
Figure 10B:
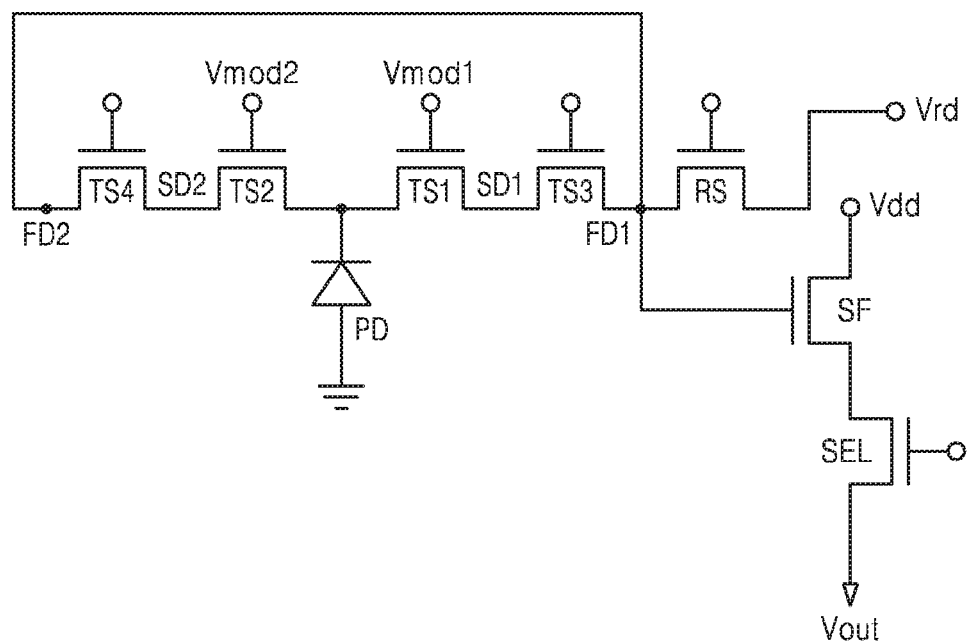
FIG. 10B is an equivalent circuit diagram of the unit pixel of the image sensor according to an embodiment.

FIG. 10A is a cross-sectional view illustrating elements of a unit pixel of an image sensor 4a according to an embodiment. FIG. 10B is an equivalent circuit diagram of the unit pixel of the image sensor 4a according to an embodiment. The same elements as those in FIGS. 9A and 9B will not be repeatedly explained in FIGS. 10A and 10B.

Referring to FIGS. 10A and 10B, unlike in the image sensor 4 of FIGS. 9A and 9B, in the image sensor 4a, one source follower transistor SF and one selection transistor SEL are connected to the first charge storage region FD1 262 and the second charge storage region FD2 272, and one reset transistor RS is connected to the first charge storage region FD1 262 and the second charge storage region FD2 272. That is, the first storage diffusion region SD1 266 and the first charge storage region FD1 262, and the second storage diffusion region SD2 276 and the second charge storage region FD2 272 may share one source follower transistor SF, one selection transistor SEL, and one reset transistor RS.

An image sensor according to the present disclosure may include at least two vertical transfer gates and may have a BSI structure. Accordingly, since a pixel of the image sensor may be miniaturized and a gate of a transfer transistor may be relatively long, a sensitivity of the image sensor may be increased.

While the image sensor for measuring distance has been particularly shown and described with reference to embodiments thereof, it will be understood that various changes in form and details may be made therein without departing from the spirit and scope of the following claims.

What is claimed is:

1. An image sensor, comprising:
a semiconductor substrate having a first conductivity type and comprising a first surface and a second surface that are opposite to each other and a well region adjacent to the first surface, wherein the semiconductor substrate has a plurality of recesses formed in the second surface to be sunk toward the first surface;
a first vertical transfer gate and a second vertical transfer gate spaced apart from each other and extending in a thickness direction of the semiconductor substrate from the first surface to pass through at least a part of the well region;
a photoelectric conversion region having a second conductivity type, which is different from the first conductivity type, located in the semiconductor substrate between the well region and the second surface, and overlapping the first vertical transfer gate and the second vertical transfer gate in the thickness direction of the semiconductor substrate;
a wiring structure located on the first surface of the semiconductor substrate;
a negative fixed charge layer, an anti-reflection layer, and a microlens that are sequentially stacked on the second surface of the semiconductor substrate; and
a plurality of scattering induction layers respectively located in the plurality of recesses and formed of an insulating material,
wherein the negative fixed charge layer surrounds the plurality of scattering induction layers so that the plurality of scattering induction layers and the second surface of the semiconductor substrate are spaced apart from each other.

2. The image sensor of claim 1, wherein the photoelectric conversion region comprises a first photoelectric conversion region, and a second photoelectric conversion region located between the first photoelectric conversion region and the well region and having a width less than a width of the first photoelectric conversion region.

3. The image sensor of claim 2, wherein the second photoelectric conversion region overlaps the first vertical transfer gate and the second vertical transfer gate in the thickness direction of the semiconductor substrate.

4. The image sensor of claim 2, wherein an impurity concentration of the second photoelectric conversion region is greater than an impurity concentration of the first photoelectric conversion region.

5. The image sensor of claim 2, wherein the first photoelectric conversion region overlaps all of the second photoelectric conversion region in the thickness direction of the semiconductor substrate.

6. The image sensor of claim 1, further comprising:
a deep trench insulator (DTI) structure surrounding the photoelectric conversion region and extending from the second surface of the semiconductor substrate to the first surface.

7. The image sensor of claim 1, further comprising:
a rear reflection layer located on the wiring structure.

8. The image sensor of claim 1, further comprising:
a first charge storage region and a second charge storage region each having the second conductivity type and located in the well region adjacent to the first surface to be spaced apart from each other.

9. The image sensor of claim 8, wherein the first charge storage region is located at a side of the first vertical transfer gate to be opposite to the second vertical transfer gate, and
the second charge storage region is located at a side of the second vertical transfer gate to be opposite to the first vertical transfer gate.

10. The image sensor of claim 1, wherein pulse voltages having a phase difference of 180° therebetween are applied to the first vertical transfer gate and the second vertical transfer gate.

11. An image sensor, comprising:
a wiring structure;
a well region comprising a demodulation region and located on and in contact with the wiring structure;
a photoelectric conversion region located on the well region;
a microlens located on the photoelectric conversion region;
at least two transfer gate structures spaced apart from each other with the demodulation region therebetween and each comprising a vertical transfer gate extending in a thickness direction of the well region to pass through at least a part of the well region and a transfer gate insulating film surrounding the vertical transfer gate, and
a plurality of first barrier impurity regions located on portions of the well region other than the demodulation region and adjacent to the photoelectric conversion region to be spaced apart from the at least two transfer gate structures, the first barrier impurity regions having an impurity concentration greater than an impurity concentration of the well region.

12. The image sensor of claim 11, further comprising:
a second barrier impurity region located on a portion of the demodulation region adjacent to the wiring structure and having an impurity concentration greater than the impurity concentration of the well region.

13. The image sensor of claim 12, wherein the portion of the demodulation region on the second barrier impurity region has a conductivity type different from a conductivity type of each of the well region and the second barrier impurity region.

14. The image sensor of claim 11, wherein the photoelectric conversion region comprises a first photoelectric conversion region located adjacent to the microlens and a second photoelectric conversion region located adjacent to the well region, wherein an impurity concentration of the first photoelectric conversion region is less than an impurity concentration of the second photoelectric conversion region, and a width of the first photoelectric conversion region is greater than a width of the second photoelectric conversion region.

15. An image sensor having a backside illumination (BSI) structure and comprising:

a semiconductor substrate having a first conductivity type and comprising a first surface, a second surface opposite to the first surface, and a well region adjacent to the first surface wherein the semiconductor substrate has a plurality of recesses formed in the second surface to be sunk toward the first surface;

a plurality of vertical transfer gates spaced apart from one another and extending from the first surface towards the second surface to pass through at least a part of the well region;

a first photoelectric conversion region located in the semiconductor substrate adjacent to the second surface; and a second photoelectric conversion region having a second conductivity type, which is different from the first conductivity type, located between the first photoelectric conversion region and the well region, and having a width and an impurity concentration respectively less and greater than a width and an impurity concentration of the first photoelectric conversion region;

a negative fixed charge layer, an anti-reflection layer, and a microlens that are sequentially stacked on the second surface of the semiconductor substrate; and a plurality of scattering induction layers respectively located in the plurality of recesses and formed of an insulating material, wherein the negative fixed charge layer surrounds the plurality of scattering induction layers so that the plurality of scattering induction layers and the second surface of the semiconductor substrate are spaced apart from each other.

16. The image sensor of claim 15, wherein the second surface of the semiconductor substrate is a surface on which light is incident.

17. The image sensor of claim 15, wherein the second photoelectric conversion region overlaps each of the plurality of vertical transfer gates in a thickness direction of the semiconductor substrate, and the first photoelectric conversion region overlaps all of the second photoelectric conversion region.

* * * * *